(12) United States Patent
Oikawa

(10) Patent No.: US 11,749,597 B2
(45) Date of Patent: Sep. 5, 2023

(54) SEMICONDUCTOR DEVICE

(71) Applicant: RENESAS ELECTRONICS CORPORATION, Tokyo (JP)

(72) Inventor: Ryuichi Oikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 64 days.

(21) Appl. No.: 17/068,422

(22) Filed: Oct. 12, 2020

(65) Prior Publication Data

US 2021/0159166 A1 May 27, 2021

(30) Foreign Application Priority Data

Nov. 22, 2019 (JP) ................................. 2019-211568

(51) Int. Cl.
| | | |
|---|---|---|
| *H01L 23/522* | (2006.01) | |
| *H01L 23/64* | (2006.01) | |
| *H05K 1/02* | (2006.01) | |
| *H01L 23/528* | (2006.01) | |
| *H01L 49/02* | (2006.01) | |

(52) U.S. Cl.
CPC ........ *H01L 23/5223* (2013.01); *H01L 23/528* (2013.01); *H01L 23/642* (2013.01); *H01L 28/60* (2013.01); *H05K 1/025* (2013.01); *H05K 1/0231* (2013.01)

(58) Field of Classification Search
CPC ................ H01L 23/528; H01L 23/5384; H01L 23/5385; H01L 28/60; H01L 2924/15192; H01L 2224/16145; H01L 2224/32225; H05K 1/0243; H05K 1/0213–0253
See application file for complete search history.

(56) References Cited

U.S. PATENT DOCUMENTS

| | | | |
|---|---|---|---|
| 9,549,461 B2 | 1/2017 | Toyama et al. | |
| 9,917,026 B2 | 3/2018 | Oikawa et al. | |
| 11,247,439 B2* | 2/2022 | Takagishi | ................ H01L 33/56 |
| 2002/0085334 A1* | 7/2002 | Figueroa | .................. H01G 4/30 |
| | | | 361/301.4 |
| 2005/0218502 A1* | 10/2005 | Sunohara | ................ H01L 23/50 |
| | | | 257/E23.079 |
| 2011/0209904 A1* | 9/2011 | Ishida | .................. H05K 1/0222 |
| | | | 174/257 |
| 2012/0049368 A1* | 3/2012 | Tanaka | .............. H01L 23/49822 |
| | | | 257/774 |

(Continued)

FOREIGN PATENT DOCUMENTS

| | | |
|---|---|---|
| JP | 2015-154062 A | 8/2015 |
| WO | 2016/103359 A1 | 6/2016 |

*Primary Examiner* — Victor A Mandala
*Assistant Examiner* — Lawrence C Tynes, Jr.
(74) *Attorney, Agent, or Firm* — McDermott Will & Emery LLP

(57) ABSTRACT

A semiconductor device comprises a wiring substrate and a semiconductor chip. In the wiring substrate, a plurality of micro-elements each comprised of a stacked structure including a power supply pattern and a ground pattern is arranged at a predetermined interval. In each of the plurality of micro-elements, the power supply pattern is formed in a wiring layer located one layer above or one layer below a wiring layer in which the ground pattern is formed. A power supply potential is to be supplied to the power supply patter, and a ground potential is to be supplied to the ground patter.

8 Claims, 29 Drawing Sheets

(56) References Cited

U.S. PATENT DOCUMENTS

| | | | |
|---|---|---|---|
| 2014/0117552 A1* | 5/2014 | Qian | H01L 23/5383 |
| | | | 257/E23.141 |
| 2014/0151904 A1* | 6/2014 | Nakashiba | H01L 23/528 |
| | | | 257/777 |
| 2014/0291859 A1* | 10/2014 | Kiwanami | H01L 23/49822 |
| | | | 257/774 |
| 2014/0360759 A1* | 12/2014 | Kunieda | H01L 23/5381 |
| | | | 174/251 |
| 2015/0357276 A1* | 12/2015 | Shimizu | H01L 23/49827 |
| | | | 361/783 |
| 2016/0099197 A1* | 4/2016 | Uematsu | H01L 23/5385 |
| | | | 257/759 |
| 2017/0352488 A1* | 12/2017 | Fujii | H01G 4/1218 |
| 2018/0254252 A1* | 9/2018 | Nakagawa | H01L 23/50 |
| 2018/0331035 A1* | 11/2018 | Zhang | H01L 24/17 |
| 2019/0131224 A1* | 5/2019 | Choi | H01L 24/20 |

* cited by examiner

SEMICONDUCTOR DEVICE

CROSS-REFERENCE TO RELATED APPLICATIONS

The disclosure of Japanese Patent Application No. 2019-211568 filed on Nov. 22, 2019 including the specification, drawings and abstract is incorporated herein by reference in its entirety.

BACKGROUND

The present invention relates to a semiconductor device, and the present invention can be suitably applied to a semiconductor device including, for example, a semiconductor chip and a semiconductor substrate.

A semiconductor package is manufactured by mounting a semiconductor chip on a wiring substrate. Also, an electronic device is manufactured by mounting the semiconductor package on a wiring substrate. It is necessary to supply a power supply voltage and a ground potential to the semiconductor chip in the semiconductor package. Therefore, a wiring (power supply wiring) to which the power supply voltage is applied (supplied) and a wiring (ground wiring) to which the ground potential is applied (supplied) are formed in the wiring substrate.

There are disclosed techniques listed below.
[Patent Document 1] Japanese Unexamined Patent Application Publication No. 2015-154062
[Patent Document 2] WO 2016/103359

An electronic device using a wiring substrate in which a power supply plane and a ground plane are formed is described in each of Patent Document 1 and Patent Document 2.

SUMMARY

In a semiconductor device including the semiconductor chip and the semiconductor substrate, the power supply voltage is supplied to the semiconductor chip through the power supply wiring of the wiring substrate. Therefore, it is desired to improve the performance of the semiconductor device by suppressing the variation of the power supply voltage to be supplied to the semiconductor chip.

Other objects and novel features will become apparent from the description of this specification and the accompanying drawings.

According to one embodiment, a semiconductor device comprises: a first wiring substrate including a plurality of wiring layers; and a first semiconductor chip. Also, the first wiring substrate comprises a plurality of first laminated structures. Also, each of the plurality of first laminated structures includes: a first conductive pattern formed in a first wiring layer of the plurality of wiring layers, and extended in a first direction; and a second conductive pattern formed in a second wiring layer of the plurality of wiring layers, and extended in the first direction. Here, the second wiring layer is located one layer below the first wiring layer. Also, the plurality of first laminated structures is provided at a first interval in a second direction crossing to the first direction. Also, one of a power supply potential and a ground potential is to be supplied to the first conductive patter. Further, another one of the power supply potential and the ground potential is to be supplied to the second conductive patter.

According to another one embodiment, a semiconductor device comprising: a first wiring substrate including a plurality of wiring layers; and a first semiconductor chip. Also, the first wiring substrate comprises: a first laminated structure; and a second laminated structure. Also, the first laminated structure includes: a first conductive pattern formed in a first wiring layer of the plurality of wiring layers, and extended in a first direction; and a second conductive pattern formed in a second wiring layer of the plurality of wiring layers, and extended in the first direction. Here, the second wiring layer is located one layer below the first wiring layer. Also, the second laminated structure includes: a third conductive pattern formed in the first wiring layer of the plurality of wiring layers, and extended in the first direction; and a fourth conductive pattern formed in the second wiring layer of the plurality of wiring layers, and extended in the first direction. Also, the first laminated structure and the second laminated structure are alternately provided at a first interval in a second direction crossing to the first direction. Also, one of a power supply potential and a ground potential is to be supplied to each of the first conductive patter and the fourth conductive pattern. Further, another one of the power supply potential and the ground potential is to be supplied to each of the second conductive patter and the third conductive pattern.

DETAILED DESCRIPTION

Figure 1:
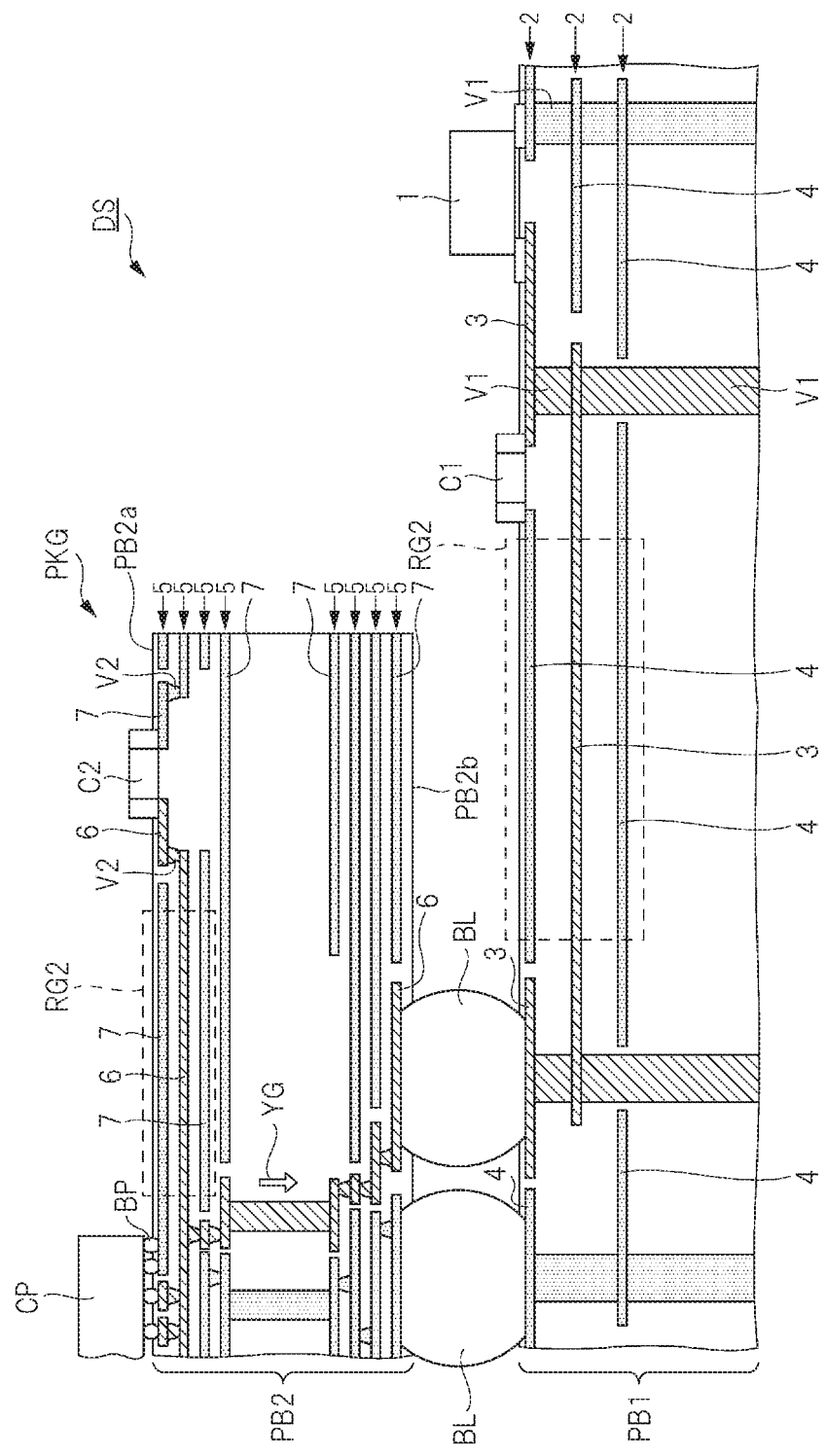
FIG. 1 is a cross-sectional view of an electronic device according to one embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Embodiment(s) will be explained in detail based on each drawing. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

Embodiment 1

<Whole Configuration of Electric Device>

Figure 2:
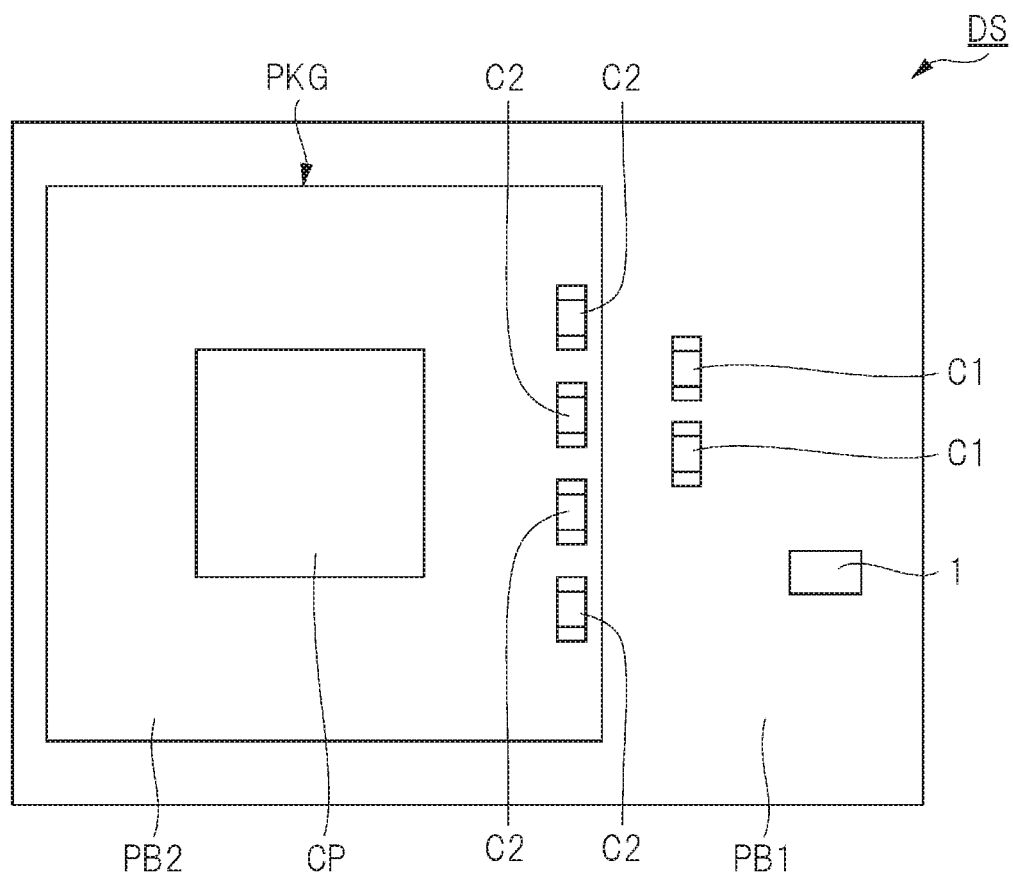
FIG. 2 is a plan view of the electronic device according to one embodiment.
Figure 3:
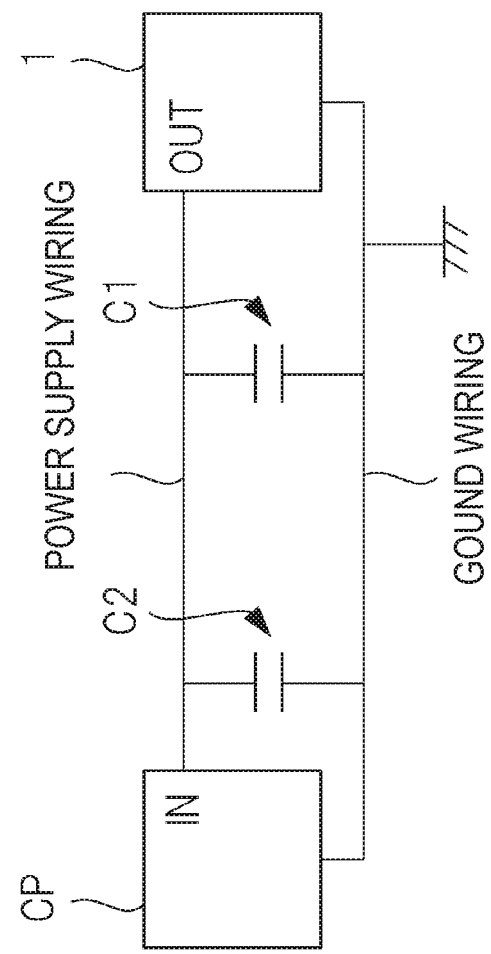
FIG. 3 is a circuit diagram showing the relation between a semiconductor chip and a Voltage Regulator Module (VRM) and a capacitor in the electronic device according to one embodiment.

FIG. 1 is a cross-sectional view of an electronic device (semiconductor device) DS according to the present embodiment, FIG. 2 is a plan view (top view) of the electronic device OS according to the present embodiment. FIG. 3 is a circuit diagram showing the relationship between a semiconductor chip CP and a Voltage Regulator Module (VRM) 1 and capacitors C1 and C2 in the electronic device DS according to the present embodiment.

As shown in FIGS. 1 and 2, the electronic device DS of the present embodiment includes a wiring substrate (mounting substrate) PB1, a semiconductor package (semiconductor device) PKG, a capacitor C1, and a voltage regulator module (Voltage Regulator Module) 1 mounted on the wiring substrate PB1. Further other electronic components (not shown) may be mounted on the interconnect substrate PB1. In FIG. 1, a plurality of capacitors C1 (three in this case) are mounted on the wiring substrate PB1, but the number of capacitors C1 mounted on the wiring substrate PB1 can be changed. As the capacitor C1, for example, a chip capacitor can be used. The capacitor C1 is a two-terminal capacitor, but may also be a three-terminal capacitor.

The semiconductor device PKG includes a wiring substrate PB2, and a semiconductor chip CP and a capacitor C2 mounted on the wiring substrate PB2. Further other electronic components (not shown) may be mounted on the interconnect substrate PB2. In FIG. 1, a plurality of capacitors C2 (four in this case) are mounted on the wiring substrate PB2, but the number of capacitors C2 mounted on the wiring substrate PB2 can be changed. As the capacitor C2, for example, a chip capacitor can be used. The capacitor C2 is a two-terminal capacitor, but may be a three-terminal capacitor.

In the electronic device DS, since semiconductor device PKG including the semiconductor chip CP is mounted on the interconnect substrate PB1, the electronic device DS includes the semiconductor chip CP. For this reason, electronic device DSs can also be regarded as semiconductor device.

The wiring substrate PB1 has a semiconductor device PKG, a capacitor C1 and VRM 1 mounted upper surface (main surface), and a lower surface opposite to upper surface (not shown in FIG. 2), in a plan view, has a rectangular (more specifically rectangular) outer shape.

The wiring substrate PB2 has a upper surface (main surface) PB2a on which the semiconductor chip CP and the capacitor C2 are mounted, and a lower surface (main surface) PB2b opposed to upper surface PB2a, and has a rectangular (more specifically, rectangular) outer shape in plan view. The wiring substrate PB2 can function as an interposer (relay substrate) for electrically connecting the semiconductor chip CP and the capacitor C2 mounted on upper surface PB2a of the wiring substrate PB2 to the wiring substrate PB1 (mounting substrate, motherboard) on which semiconductor device PKG is mounted.

The wiring substrate PB1, for example, a plurality of insulator layers (insulating layer, dielectric layer) and a plurality of wiring layers (conductor layer, conductor pattern layer) 2 are laminated alternately and integrated multilayer wiring substrate (multilayer substrate) Therefore, the wiring substrate PB1 has a plurality of wiring layers 2. Wiring substrate between the upper and lower surfaces of the plurality of insulator layers constituting the PB1 (between the layers), the wiring layer 2 is formed, respectively. Therefore, between the wiring layer 2 adjacent in the thickness direction, the insulator layer is interposed. Each wiring layer 2 is processed into a predetermined planar shape (pattern), it can also be regarded as an aggregate of a plurality of conductor patterns (wiring pattern).

Each of the plurality of wiring layers 2 constituting the wiring substrate PB1 has a plurality of wirings as required, and these wirings constitute an inner wiring of the wiring substrate PB1. The wiring substrate PB1 includes, as inner wirings, a power supply wiring 3 to which a power supply voltage (power supply potential) is supplied, u ground wiring 4 to which a ground potential (reference potential, grounding potential, GND potential) is supplied, and a signal wiring to which a signal is transmitted, and these wirings are formed by a plurality of wiring layers 2 constituting the wiring substrate PB1. Power supply wiring (3, 6) is a conductor pattern power supply voltage is supplied (power supply potential conductor pattern), the ground wiring (4, 7) is a conductor pattern ground potential is supplied (ground potential conductor pattern). In wiring substrate PB1, wiring layer 2 adjacent to the thickness direction is electrically connected through a via V1 formed in the insulator layer between it, where appropriate. Incidentally, the via V1 is made of a conductor in the via hole formed in the insulator layer (through hole).

The wiring substrate PB2, for example, a plurality of insulator layers (insulating layer, dielectric layer) and a plurality of wiring layers (conductor layer, conductor pattern layer) 5 are laminated alternately and integrated multilayer wiring substrate (multilayer substrate). Therefore, the wiring substrate PB2 has a more than one wiring layer 5. Wiring substrate between the upper and lower surfaces of the plurality of insulator layers constituting the PB2 (between the layers), the wiring layer 5 is formed, respectively. Therefore, between the wiring layer 5 adjacent in the thickness direction, the insulator layer is interposed. Each wiring layer 5 is processed into a predetermined planar shape (pattern), it can also be regarded as an aggregate of a plurality of conductor patterns.

Each of the plurality of wiring layers 5 constituting the wiring substrate PB2 has a plurality of wirings as required, and these wirings constitute an inner wiring of the wiring substrate PB2. The wiring substrate PB2 includes, as inner wirings, a power supply wiring 6 to which a power supply voltage (power supply potential) is supplied, u ground wiring to which a ground potential is supplied, and a signal wiring to which a signal is transmitted, and these wirings are formed by a plurality of wiring layers 5 constituting the wiring substrate PB2. In the wiring substrate PB2, the wiring layer 5 adjacent in the thickness direction, if desired, is electrically connected through a via V2 formed in the insulator layer therebetween, Incidentally, the via V2 is made of a conductor in the via hole formed in the insulator layer.

For simplicity, in FIG. 1, the power supply wiring 3 and the via V1 to which the power supply voltages are supplied are shown by hatching with oblique lines, and the ground wiring 4 and the via V1 to which the ground potential is supplied are shown by hatching with dots. Further, in FIG. 1, the wiring substrate PB2, the power supply line 6 and the via V2 power supply voltage is supplied, shown with hatching of the diagonal line, also the ground wiring 7 and the via V2 ground potential is supplied, it is shown with a hatching of dots. There are also signal lines in each wiring substrate PB1 and PB2, but the signal lines are not shown in FIG. 1. Further, FIG. 1 is a cross-sectional view, but portions other than each of the power supply wirings 3, 6 to which the power supply voltage is to be supplied, the vias V1, V2 to which the power supply voltage is to be supplied, the ground wirings 4, 7 to which the ground potential is to be supplied, and the vias V1, V2 to which the ground potential is to be supplied are omitted hatching.

The wiring substrate PB1 is formed, for example, by alternately laminating a conductive layer and an insulating layer (prepreg layer) on both upper and lower surfaces of a hard insulating layer (core insulating layer) in which a glass fiber is impregnated with a resin by a build-up method. Further, as the wiring substrate PB1, without having a core insulator layer made of a hard material, formed by laminating the insulator layer (prepreg layer) and the conductor layer in this order, so-called, it may be used coreless substrate. The same applies to the wiring substrate PB2.

The uppermost layer on upper surface side of the wiring substrate PB1 is composed of a solder resist layer (solder resist layer, insulator layer), and the lowermost layer on the lower surface side of the wiring substrate PB1 is composed of a solder resist layer (not shown in FIG. 2). The solder resist layer on upper surface side of the wiring substrate PB1 is formed so as to cover the wiring layer 2 of the uppermost layer among the plurality of wiring layers 2 included in the wiring substrate PB1. Incidentally, the wiring layer 2 of the uppermost layer of the plurality of wiring layers 2 having the wiring substrate PB1 includes a plurality of terminal patterns for solder balls BL connection (lands, terminals, electrodes), a plurality of terminal patterns for capacitor C1 connection (lands, terminals, electrodes), a plurality of terminal patterns for VRM 1 connection (lands, terminals, electrodes), but they are exposed from the opening of the solder resist layer. On upper surface side of the wiring substrate PB1, each terminal (electrode) of the capacitor C1 is electrically and mechanically connected to a terminal pattern for connecting the capacitor C1 of the wiring substrate PB1 via solder, and each terminal (corresponding to an input terminal, an output terminal, and a ground terminal described later) of VRM 1 is electrically and mechanically connected to a terminal pattern for connecting VRM 1 of the wiring substrate PB1 via solder.

The uppermost layer on upper surface side of the wiring substrate PB2 is composed of a solder resist layer (solder resist layer, insulator layer), and the lowermost layer on the lower surface side of the wiring substrate PB2 is composed of a solder resist layer. The solder resist layer on upper surface side of the wiring substrate PB2 is formed so as to cover the wiring layer 5 of the uppermost layer among the plurality of wiring layers 5 included in the wiring substrate PB2. The solder resist layer on the lower surface of the wiring substrate PB2 is formed so as to cover the wiring layer 5 of the lowest layer among the plurality of wiring layers 5 included in the wiring substrate PB2. Incidentally, the wiring layer 5 of the uppermost layer of the plurality of wiring layers 5 having the wiring substrate PB2 includes a plurality of terminal patterns for the semiconductor chip CP connection (lands, terminals, electrodes), a plurality of terminal patterns for capacitor C2 connection (lands, terminals, electrodes), but they are exposed from the opening of the solder resist layer. On upper surface side of the wiring substrate PB2, each terminal (electrode) of the capacitor C2 is electrically and mechanically connected to a terminal pattern for connection to the capacitor C2 of the wiring substrate PB2 via solder, and each terminal (electrode) of the semiconductor chip CP is electrically and mechanically connected to a terminal pattern for connection to the semiconductor chip CP of the wiring substrate PB2 via a bump electrode EP (for example, solder bump) or the like. Further, the lowermost wiring layer of the plurality of wiring layers 5 having the wiring substrate PB2 includes a plurality of terminal patterns for solder balls BL connection (lands, terminals, electrodes), but they are exposed from the opening of the solder resist layer. A plurality of terminal patterns for connecting the solder balls BL on the lower surface PE2b side of the wiring substrate PB2 and a plurality of terminal patterns for connecting the solder balls BL on upper surface side of the wiring substrate PB1 are electrically and mechanically connected to each other via a plurality of solder balls BL. Solder ball BL can function as an external connecting terminal of semiconductor device PKG. For example, when semiconductor device PKG is mounted on the wiring substrate PB1, a plurality of solder balls BL of semiconductor device PKG are connected (bonded, soldered) to a plurality of terminal patterns for connecting the solder balls BL upper surface of the wiring substrate PB1.

The semiconductor chip CP, for example, after forming various semiconductor elements in semiconductor substrate (semiconductor wafer) made of monocrystalline silicon or the like, to form a multilayer wiring structure including a plurality of wiring layers on semiconductor substrate, further after performing the rear surface grinding of semiconductor substrate as required, semiconductor substrate by dicing or the like is obtained by separating into the semiconductor chips. Therefore, in the semiconductor chip CP, various circuits (internal circuit) are formed as necessary.

The semiconductor chip CP is flip-chip connection (face-down bonding) to upper surface PB2a of the wiring substrate PB2, the internal circuit of the semiconductor chip CP, via the internal wiring and the via of the bump electrode BP and the wiring substrate PB2, is electrically connected to the solder balls BL, further via the solder balls BL, is electrically connected to the internal wiring (wiring layer 2) of the wiring substrate PB1.

In the present embodiment, the semiconductor chip CP is face-down bonded onto the wiring substrate PB2, but as another mode, the semiconductor chip CP may be face-up bonded to upper surface PB2a of the wiring substrate PB2.

The VRM 1 generates a predetermined supply voltage. VRM 1 receives an externally supplied voltage of the electronic device DS to generate a predetermined supply voltage. The power supply voltage generated by VRM 1 is supplied to the power supply wiring 3 of the wiring substrate PB1. Therefore, VRM 1 has an input terminal supply voltage from the outside of the electronic device DS is input, an output terminal for outputting a power supply voltage generated by VRM 1, and a ground terminal for connecting to the ground potential. The input terminal of VRM 1, the supply voltage from the outside of the electronic device DS is input through the internal wiring of the wiring substrate PB1.

The output terminal of VRM 1 is electrically and mechanically connected to the terminal pattern for the power supply of the wiring substrate PB1 via the solder. The terminal patterns for power supply of the wiring substrate PB1 are formed by a part of the power supply wiring 3 of the wiring substrate PB1. Therefore, the power supply voltage generated by VRM 1 is supplied to the power supply wiring 3 from the output terminal of VRM 1.

The ground terminal of VRM 1 is electrically and mechanically connected to the terminal pattern for ground of the wiring substrate PB1 via the solder. The ground terminal patterns of the wiring substrate PB1 are formed by a part of the ground wiring 4 of the wiring substrate PB1. Therefore, the ground terminal of VRM 1 is electrically connected to the ground wiring of the wiring substrate PB1. The ground wiring of the wiring substrate PB1, the ground potential can be supplied from the outside of the electronic device DS.

The capacitor C1 is disposed between the power supply wiring and the ground wiring of the wiring substrate PB1, and connects the power supply wiring and the ground wiring of the wiring substrate PB1 via the capacitor C1 The capacitor C1 can function as a decoupling capacitor, i.e., a power supply capacitor or a power supply bypass capacitor.

Therefore, one terminal (electrodes) of the capacitor C1 is electrically and mechanically connected to a terminal pattern for power supply of the wiring substrate PB1 via soldering, and this terminal pattern for power supply is formed by a part of the power supply wiring 3 of the wiring substrate PB1. Therefore, one terminal of the capacitor C1 (electrode) is electrically connected to the power supply wiring 3 of the wiring substrate PB1.

The other terminal (electrodes) of the capacitor C1 is electrically and mechanically connected to a terminal pattern for the ground of the wiring substrate PB1 via soldering, and this terminal pattern for the ground is formed by a part of the ground wiring 4 of the wiring substrate PB1. Therefore, the other terminal of the capacitor C1 (electrode) is electrically connected to the ground wiring of the wiring substrate PB1.

The power supply wiring 3 of the wiring substrate PB1 and the power supply wiring 6 of the wiring substrate PB2 are electrically connected via solder balls BL. Therefore, the power supply voltages generated by VRM 1 are supplied to the power supply wiring 3 of the wiring substrate PB1 and the power supply wiring 6 of the wiring substrate PB2. Of the plurality of terminals (pads) the semiconductor chip CP has, the terminal power supply voltage is to be supplied (pads) is electrically connected to the power supply line 6 of the wiring substrate PB2 via the bump electrode BP. Therefore, the power supply voltage generated by VRM 1 is supplied to the terminals (pads) to which the power supply voltage is to be supplied in the semiconductor chip CP via the power supply wiring 3 of the wiring substrate PB1, the solder balls BL, the power supply wiring 6 of the wiring substrate PB2, and the bump electrodes BP. Therefore, the power supply voltages generated by VRM 1 are supplied to the semiconductor chip CP through the power supply wiring 3 of the wiring substrate PB1 and the power supply wiring 6 of the wiring substrate PB2.

The ground wiring 4 of the wiring substrate PB1 and the ground wiring 7 of the wiring substrate PB2 are electrically connected via solder balls BL. Therefore, the ground potential is supplied to the ground wiring 4 of the wiring substrate PB1 and the ground wiring 7 of the wiring substrate PB2. Of the plurality of terminals (pads) the semiconductor chip CP has, the terminal to the ground potential is supplied (pads) is electrically connected to the ground wiring 7 of the wiring substrate PB2 via the bump electrode BP. Therefore, the ground potential is supplied to the terminals (pads) to which the ground potential in the semiconductor chip CP is to be supplied via the ground wiring 4 of the wiring substrate PB1, the solder balls BL, the ground wiring 7 of the wiring substrate PB2, and the bump electrodes BP.

The capacitor C2 is disposed between the power supply wiring and the ground wiring of the wiring substrate PB2, and connects the power supply wiring 6 and the ground wiring 7 of the wiring substrate PB2 via the capacitor C2.

The capacitor C2 can function as a decoupling capacitor, i.e., a power supply capacitor or a power supply bypass capacitor.

Therefore, one terminal (electrodes) of the capacitor C2 is electrically and mechanically connected to a terminal pattern for power supply of the wiring substrate PB2 via soldering, and this terminal pattern for power supply is formed by a part of the power supply wiring 6 of the wiring substrate P2. Therefore, one terminal of the capacitor C2 (electrode) is electrically connected to the power supply wiring of the wiring substrate PB2.

The other terminal (electrodes) of the capacitor C2 is electrically and mechanically connected to a terminal pattern for the ground of the wiring substrate PB2 via soldering, and this terminal pattern for the ground is formed by a part of the ground wiring 7 of the wiring substrate PB2. Therefore, the other terminal of the capacitor C2 (electrode) electrically connected to the ground wiring 7 of the wiring substrate PB2.

When the power consumption of the semiconductor chip CP is suddenly changed, resulting in a fluctuation of the power supply voltage supplied to the semiconductor chip CP by generating an induced voltage due to a current change in the power supply wiring. In contrast, by providing a decoupling capacitor (capacitors C1, C2 in this case), when, the power consumption of the semiconductor chip CP is suddenly changed, the current change portion decoupling capacitor (capacitor C1, C2 in this case) is supplied (supplemented) it is possible to suppress the fluctuation of the power supply voltage supplied to the semiconductor chip CP, it is possible to suppress the occurrence of power supply noise.

<History of Study>

The power supply and ground wirings in the wiring board will be described. As described above, since the power supply voltage and the ground potential need to be supplied to the semiconductor chip CP, both the power supply wiring and the ground wiring are formed in each wiring substrate PB1 and PB2.

The power supply impedance (mainly consisting of inductance) is desirably as small as possible (minimized). Therefore, generally, in the wiring substrate, the power supply wiring and the ground wiring are formed by a large area of the plane shape (e.g., a rectangular pattern of a large area, etc.), the power supply plane (power supply wiring of the plane shape) and the ground plane (ground wiring of the plane shape), vertically opposed arrangement techniques are used. In this case, both the power supply plane and the ground plane, it is desirable to have a shape with as little holes and chips as possible.

However, according to the study by the present inventor, it has been found that the following problems can occur in the case of a structure in which the power supply plane and the ground plane are arranged to face each other.

The structure in which the power supply plane and the ground plane are arranged facing each other vertically (hereinafter, referred to as "power supply and ground planes pair") is basically a parallel plate structure. When the cross-sectional structure (stack-up) is determined, the inductance and resistance are proportional. That is, in a power supply and ground planes pair, increasing the width of the plane reduces both inductance and resistance, and decreasing the length of the plane reduces both inductance and resistance. In a pair of power supply and ground planes, changing the interval between the power and ground planes allows the inductance to be varied without changing the resistor, so the ratio of inductance/resistance can be varied.

Here, the ratio of the inductance/resistance corresponds to a value obtained by dividing the inductance (L) by the resistance (R), hereinafter, referred to as "L/R ratio".

However, since the interval between the power supply plane and the ground plane depends on the thickness of the insulating layer constituting the wiring substrate in the power supply and ground planes pair, the manufacturing requirement of the wiring substrate is prioritized, and it is difficult to change the spacing between the power supply plane and the ground plane freely. Therefore, once it has determined the cross-sectional structure (laminated structure of the wiring substrate), in the power supply and ground planes pair, it is impossible to set the inductance and the resistor independently, it is difficult to adjust the L/R ratio. That is, in the power supply and ground planes pair, since the inductance (L) and the resistor (R) is in proportional relationship, the L/R ratio becomes a constant value, it is difficult to variable control the L/R ratio.

Figure 4:
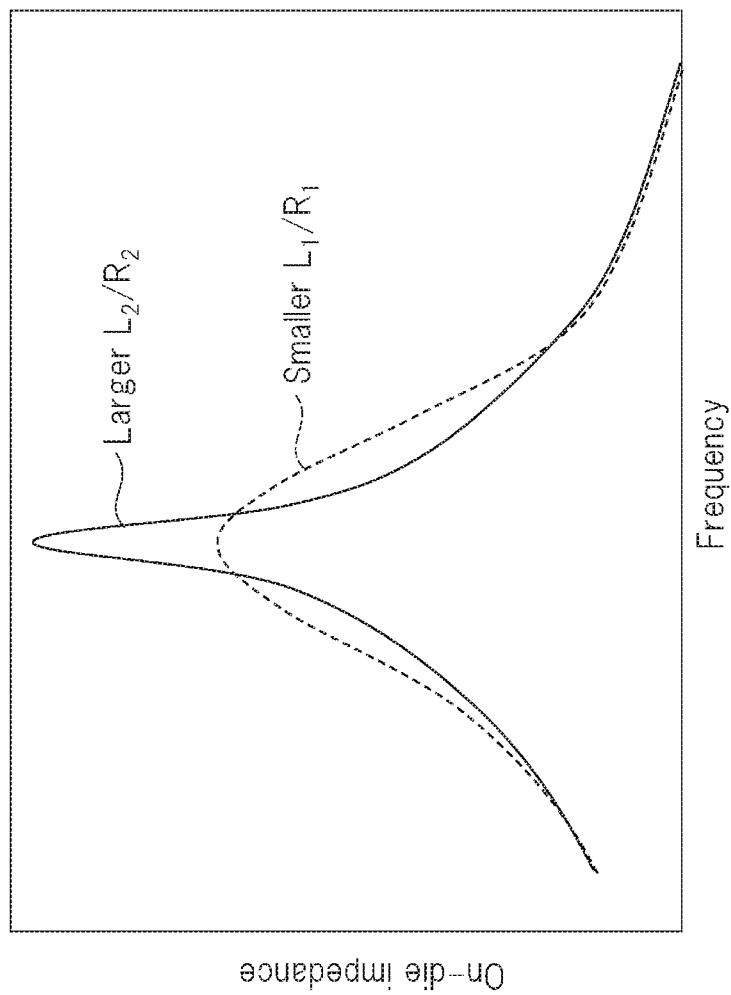
FIG. 4 is a graph showing a frequency dependence of an impedance.
Figure 5:
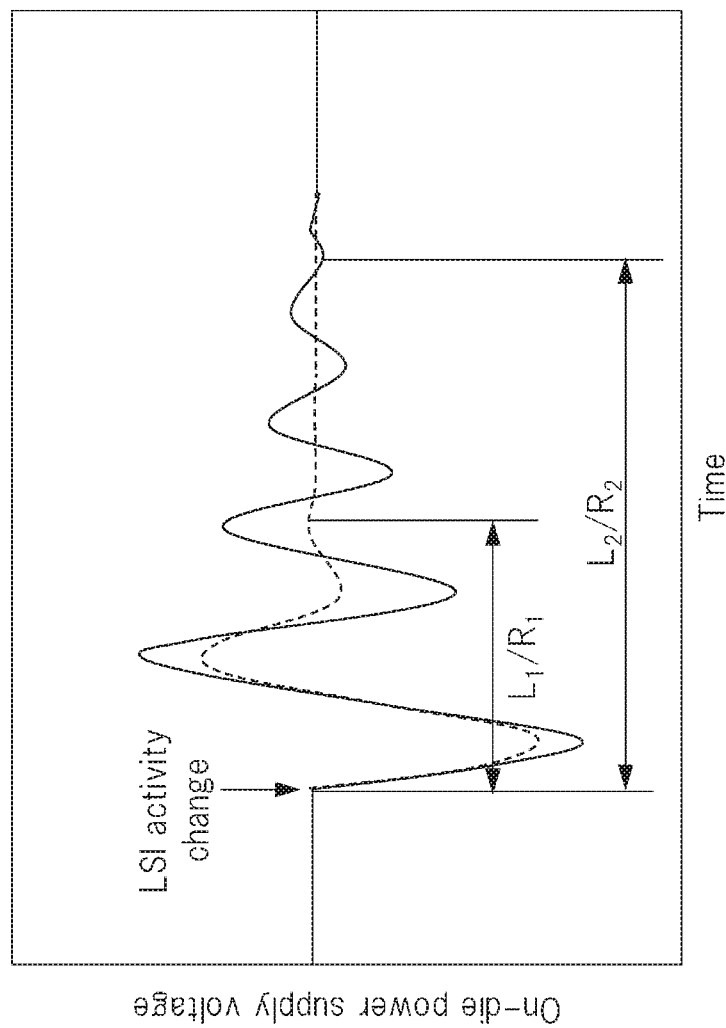
FIG. 5 is a graph showing a time change of a power supply voltage supplied to the semiconductor chip.

Here, as shown in FIGS. 4 and 5, the state of the voltage fluctuation due to abrupt changes in the operating rate of the impedance and the semiconductor chip (LSI) in the vicinity of the impedance resonance point, it must be noted that determined by the L/R ratio. FIG. 4 is a graph showing a frequency dependence of an impedance, and FIG. 5 is a graph showing a time change of a power supply voltage supplied to the semiconductor chip (LSI).

As shown in FIG. 4, the impedance (power supply impedance) shows a peak (maximum value) at the impedance resonance point (resonance frequency). Here, in FIG. 4, a graph in the case where the L/R ratio is large is shown by a solid line, and a graph in the case where the L/R ratio is small is shown by a dotted line.

As shown in the graph of FIG. 4, when the L/R ratio is large (corresponding to the graph indicated by the solid line), the impedance at the impedance resonance point (corresponding to the peak value of the graph) is high, the half width of the resonance is also narrow (i.e., the impedance changes steeply in the vicinity of the impedance resonance point). This means that when the L/R ratio is large, the power supply fluctuation i.e. power supply noise at the impedance resonance point is increased.

This problem (problem of power supply fluctuation) does not mean that the operating frequency of the semiconductor chip (LSI) must match the impedance resonance point. This is because even if the operating frequency is the same, if the operating pattern of the semiconductor chip is changed, the frequency spectrum of the current consumption is different.

For example, when the operating frequency is 1 GHz, if the operation pattern is 101010 . . . , the main frequency component of the current consumption is 1 GHz that matches the operating frequency. However, if the operation pattern is 110011001100 . . . or 1111000011110000 . . . , the main frequency component of the current consumption is 500 MHz or 250 MHz. Generally, the operation pattern of the semiconductor chip (LSI), since it changes randomly rather than fixed, if the semiconductor chip (LSI) is operating, sometimes the main frequency component of the current consumption, the resonance frequency of the power supply impedance will match, the power supply fluctuation i.e. power supply noise at that time is the maximum (peak).

An effective means of suppressing such inconveniences is to reduce the L/R ratio. As shown in the graph of FIG. 4, when the L/R ratio is small (corresponding to the graph indicated by a dotted line), the impedance at the impedance resonance point (corresponding to the peak value of the graph) is relatively low, and the half width of the resonance is also widened (i.e., the impedance in the vicinity of the impedance resonance point is relatively gently changed). This means that when the L/R ratio is small, the power supply fluctuation i.e. power supply noise at the impedance resonance point is small. The L/R ratio has a unit of time, and the physical meaning is a time constant.

If the operating rate of the semiconductor chip (LSI) (current consumption) is suddenly changed, the power supply fluctuation of the damped vibration type as shown in the graph of FIG. 5 (this is referred to as a step response) occurs. The time until the damping oscillation is fitted is the time constant L/R described above (i.e., L/R ratio). Since the time response and the frequency response are related to each other Fourier (Fourier) transform, that the half-width of the frequency response is narrow is that the time constant is long, also, that the half-width of the frequency response is wide is that the time constant is short. Of course, it is desirable that the damped oscillation fits quickly and the power supply fluctuation (amplitude of the damped oscillation) is also small.

In the Fourier transform, since the magnitude relationship of the dependent variables, that is, the magnitude relationship between the impedance and the power supply voltage fluctuation is preserved, after all, the half width of the frequency response is wide and the peak value is low desirable. In other words, it is the most effective means to make the time constant L/R (i.e., the L/R ratio) as small as possible.

However, as described above, in the power supply and ground planes pair, the time constant L/R (i.e., L/R ratio) is constant after determining the cross-sectional structure of the wiring substrate (in particular the thickness of each insulator layer constituting the wiring substrate), improvement (suppression of power supply variation by reducing the L/R ratio) is difficult.

Therefore, the present inventors have studied the power supply wiring and ground wiring to replace the power supply and ground planes pair in the wiring substrate.

<Theoretical Analysis Regarding Pair of Power Supply and Ground Planes>

Figure 6:
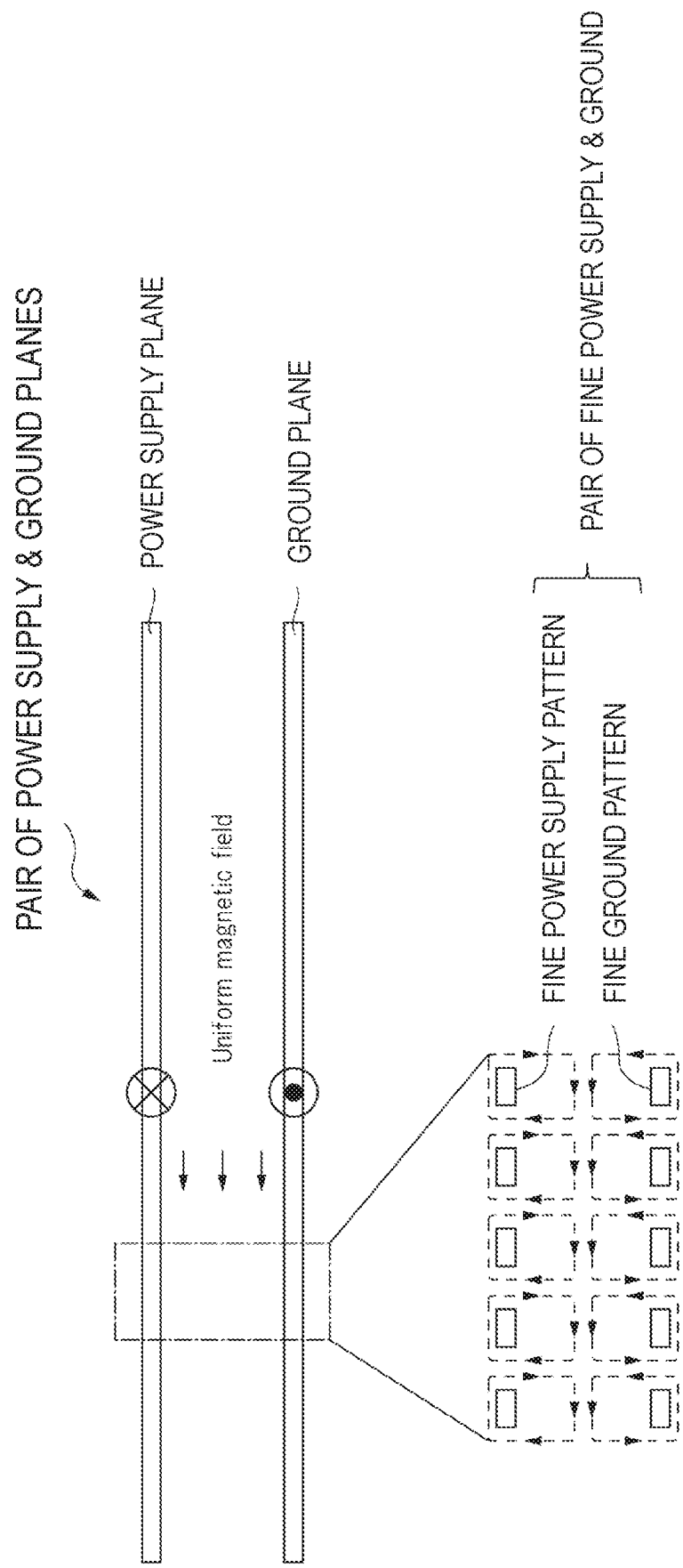
FIG. 6 is a theoretical illustration regarding a pair of power supply and ground planes.

FIG. 6 shows a theoretical analysis by the present inventor regarding a pair of power supply and ground planes that is commonly used. FIG. 6 is a theoretical illustration regarding a pair of power supply and ground planes.

According to the idea of integration, the power and ground plane pairs, in other words, the power and ground parallel plates, can be considered as an aggregate of a number of fine power and ground pairs. Here, the fine power supply and ground pair corresponds to a pair of fine power supply pattern and fine ground pattern facing in the vertical direction. It is considered that a uniform magnetic field is generated in the parallel plate (power supply and ground planes pair) as a result of the combined magnetic field of the aggregate of fine power supply and ground pairs.

Here, the magnetic field generated by a fine power supply and ground pair, and the magnetic field generated by the fine power supply and ground pair adjacent thereto is opposite to each other, repulsive. That is, a fine power supply and ground pair and the fine power supply and ground pair adjacent to it shows a positive mutual inductance. Therefore, the parallel combined inductance of the two fine power supply and ground pairs adjacent, than half the inductance of one fine power supply and ground pairs, the amount that the influence of mutual inductance occurs, becomes larger. That is, if there is no mutual inductance, the parallel combined inductance of the two fine power supply and ground pairs adjacent, although it should be half of the inductance of one power supply and ground pairs, two fine power supply and ground pairs adjacent as described above since the pair shows a positive mutual inductance, the parallel combined inductance of the two fine power supply and ground pairs adjacent is greater than half of the inductance of one fine power supply and ground pairs. This is true for all fine power supply and ground pairs.

Figure 7:
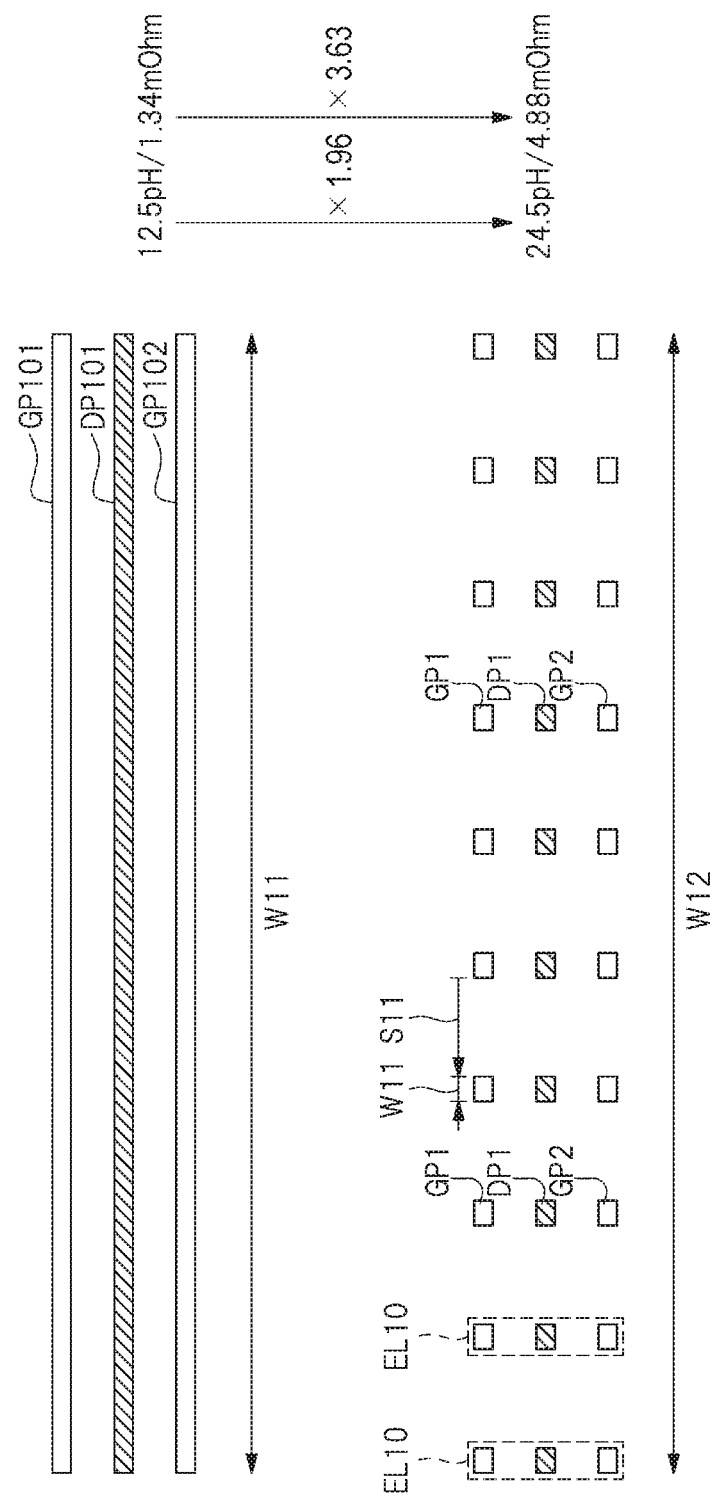
FIG. 7 is a cross-sectional view showing a power supply wiring of a wiring substrate and a ground wiring of the wiring substrate.

Therefore, we assume a case where parallel plates (power supply and ground planes pairs) are decomposed into a number of fine power supply and ground pairs, and they are arranged spaced apart in the horizontal direction, and then their parallel combined inductances are obtained. In this case, by fine power supply and ground pairs adjacent in the horizontal direction are spaced apart from each other, the influence of mutual inductance of the fine power supply and ground pairs adjacent in the horizontal direction is reduced, the parallel combined inductance of a large number of fine power supply and ground pairs should be smaller than the inductance of the parallel plate (power supply and ground planes pair). FIG. 7 shows a result of verifying this hypothesis by electromagnetic field analysis.

FIG. 7 is a cross-sectional view showing a power supply wiring of a wiring substrate and a ground wiring of the wiring substrate. Also, in FIG. 7, a wiring (power supply wiring) to which the power supply voltage is applied (supplied) is hatched diagonal, while a wiring (ground wiring) to which the ground potential is applied (supplied) is omitted hatching, so as to be easy to distinguish between the power supply wiring and the ground wiring.

In an upper side of FIG. 7, a cross-sectional view of the laminated structure of the large area ground plane GP101, the large area power supply plane DP101 and the large area ground plane GP102 is shown. Further, in a lower side of FIG. 7, a line-shaped ground pattern GP1 having a fine width, a line-shaped power supply pattern DP1 having a fine width, the micro-element consisting of a laminated structure of a line-shaped ground pattern GP2 having a fine width (laminated structure) EL10 are shown cross-sectional view when connected in parallel by arranging a large number at predetermined intervals. Then, the parallel combined inductance and the parallel combined resistance in the case of the structure shown in the lower side of FIG. 7, obtained by a two-dimensional electromagnetic field simulator, the results of comparison with the inductance and the resistance in the case of the structure shown in the upper side of FIG. 7 is also shown in FIG. 7. An electric current direction is a direction substantially perpendicular to the paper surface of FIG. 7. Power supply pattern DP1 and the ground pattern GP1, GP2 in each micro-element (fine element) EL10 extend in a direction substantially perpendicular to the paper surface of FIG. 7, respectively. Power supply pattern DP1 of the micro-element EL10 arranged in large numbers are connected at the end of the extending direction of the power supply pattern DP1, also, the ground pattern GP1, GP2 of the micro-element EL10 arranged in large numbers are connected at the end of the extending direction of the line-shaped ground pattern GP1, GP2 (short circuit-circuited).

The width W11 of the plane shown in the upper side of FIG. 7 and the width W12 of the entire aggregate of a large number of micro-elements EL10 shown in the lower side of FIG. 7 are the same (W11-W12). Further, the length of the depth direction of the plane shown in the upper side of FIG. 7 (the direction substantially perpendicular to the plane of FIG. 7), the length of the depth direction of each micro-element EL10 shown in the lower side of FIG. 7 (the direction substantially perpendicular to the plane of FIG. 7) is the same as each other. The thickness of the power supply plane DP101 shown in the upper side of FIG. 7 and the thickness of the power supply pattern DP1 of the micro-element EL1Q shown in the lower side of FIG. 7 are the same with each other. Further, the thickness of the ground plane GP101 shown in the upper side of FIG. 7, and the thickness of the ground pattern GP1 of the micro-element EL10 shown in the lower side of FIG. 7 are the same with each other. Further, the thickness of the ground plane GP102 shown in the upper side of FIG. 7, and the thickness of the ground pattern GP2 of the micro-element EL10 shown in the lower side of FIG. 7 are the same with each other. The interval between the power supply plane DP101 and the ground plane GP101 shown in the upper side of FIG. 7 is the same as the spacing between the power supply pattern DP1 and the ground pattern GP1 of the micro-element EL10 shown in the lower side of FIG. 7. Also, the interval between the power supply plane DP101 and the ground plane GP102 shown in the upper side of FIG. 7 is the same as the spacing between the power supply pattern DP1 and the ground pattern GP2 of the micro-element EL10 shown in the lower side of FIG. 7.

In the structure of the aggregate of a large number of micro-elements EL10 shown in the lower side of FIG. 7, the widths W11 of the micro-elements EL10 are ¼ of the intervals E11 between adjacent micro-elements EL10. That is, W11:S11=1:4 holds. That is, the structure shown in the lower side of FIG. 7 corresponds to a case in which the reduced area created by reducing the respective plane dimensions (plane area) of the power supply plane DP101 and the ground plane GP101, GP102 in the structure shown in the upper side of FIG. 7 is replaced with a space. Therefore, in the structure shown in the lower side of FIG. 7, the total width and total volume of the conductor is ⅕ of the width and volume of the conductor plane shown in the upper side of FIG. 7.

When the magnetic field distribution (magnetic field distribution at 100 MHz) was obtained by the two-dimensional electromagnetic field simulator for the case of the structure shown in the upper side of FIG. 7 and the case of the structure shown in the lower side of FIG. 7, the interaction between the adjacent micro-element EL10 was confirmed to be sufficiently small in the case of the structure shown in the lower side of FIG. 7. In the case of the structure shown in the upper side of FIG. 7, the inductance was 12.5 pH and the resistor was 1.34 mΩ, and in the case of the structure shown in the lower side of FIG. 7, the inductance (parallel synthetic inductance) was 24.5 pH and the resistance (parallel synthetic resistance) was 4.88 mΩ. That is, the inductance in the case of the structure shown in the lower side of FIG. 7 was 1.96 times the inductance in the case of the structure shown in the upper side of FIG. 7, and the resistor in the case of the structure shown in the lower side of FIG. 7 was 3.63 times the resistance in the case of the structure shown in the upper side of FIG. 7.

Thus, in the case of the structure shown in the lower side of FIG. 7, as compared with the case of the structure shown in the upper side of FIG. 7, but the total width and the total volume of the conductor is ⅕, the parallel combined inductance is not 5 times (smaller than 5 times) it can be seen that. That is, in the structure shown in the lower side of FIG. 7, while maintaining the number of micro-element EL10, when the interval S11 of the adjacent micro-element EL10 close to zero, the parallel combined inductance of the aggregate of micro-element. EL10 is close to five times that of the structure shown in the upper side of FIG. 7. In contrast, if sufficiently ensuring the interval S11 of the micro-element EL10 adjacent as in the structure shown in the lower side of FIG. 7, the interaction of the micro-element EL10 adjacent (positive mutual inductance) is reduced, the aggregate of the micro-element EL10 inductance (parallel combined inductance) is considered to be considerably smaller than five times that of the structure shown in the upper side of FIG. 7.

On the other hand, with respect to the resistivity of the micro-element EL10, the interaction of the adjacent micro-element EL10 has little effect. Therefore, even if the distance S11 between adjacent micro-elements EL10 is changed, the resistors of the aggregates of the micro-elements EL10 become substantially the same. That is, by increasing the interval S11 of the micro-element EL10 adjacent, it is possible to reduce the inductance of the aggregate of the micro-element EL10 (parallel combined inductance), the spacing S11 of the micro-element EL10 adjacent be increased, the resistor of the aggregate of the micro-element EL10 (parallel combined resistance) will not change substantially. Thus, the rate of increase in resistance for the structure shown in the lower side of FIG. 7 (here 3.63 times) relative to the resistance for the structure shown in the upper side of FIG. 7 is greater than the rate of increase in inductance for the structure shown in the lower side of FIG. 1 (here 1.96 times) relative to the inductance for the structure shown in the upper side of FIG. 7.

Incidentally, the reason why the resistor in the case of the structure shown in the lower side of FIG. 7 is not about 5 times of the resistance in the case of the structure shown in the upper side of FIG. 7 is, due to the skin effect, the electric current flows through the region close to the surface of the conductor rather than uniformly flows through the conductor. In the case of the structure shown in the lower side of FIG. 7, the electric current can flow not only the upper and lower surfaces of the conductive pattern in each micro-element EL10, but also the side surface of the conductive pattern. Thus, it is considered that the resistor in the case of the structure shown in the lower side of FIG. 7 is slightly smaller than 5 times of the resistance in the case of the structure shown in the upper side of FIG. 7 (here 3.63 times).

The results of the simulation of FIG. 7, when comparing the structure shown in the upper side of FIG. 7 and the structure shown in the lower side of FIG. 7, the increase rate of the inductance (here 1.96 times) is considerably smaller than the increase rate of the resistor (here 3.63 times). This suggests that the hypothesis described with reference to FIG. 6 is correct. If the rate of increase of the inductance is much smaller than the rate of increase of the resistor, the above-mentioned. L/R ratio (i.e., time constant L/R) can be reduced. In the case of the structure shown in the lower side of FIG. 7, the above-mentioned L/R ratio (time constant L/R) becomes smaller than that in the case of the structure shown in the upper side of FIG. 7, specifically, it becomes 0.53 times, Based on such knowledge, the present inventor has found a design concept of the power supply wiring and the ground wiring as described below, i.e., the first art and the second technology.

<Design Concept of Power Supply Wiring and Ground Wiring>

Figure 8:
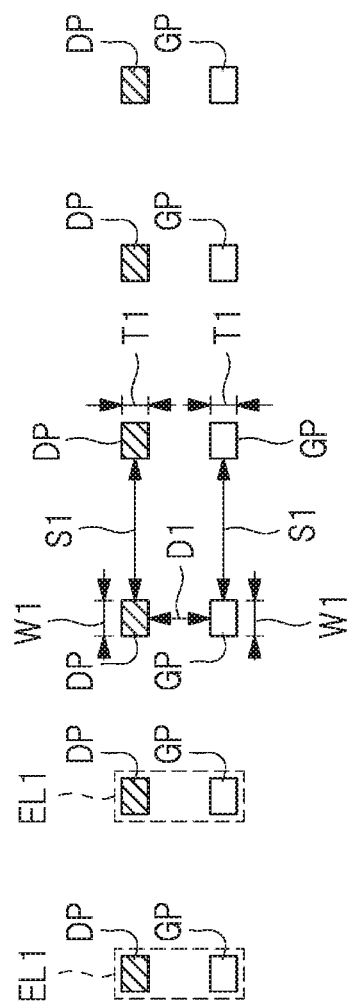
FIG. 8 is a cross-sectional view showing power supply and ground wirings applying a first technique.
Figure 9:
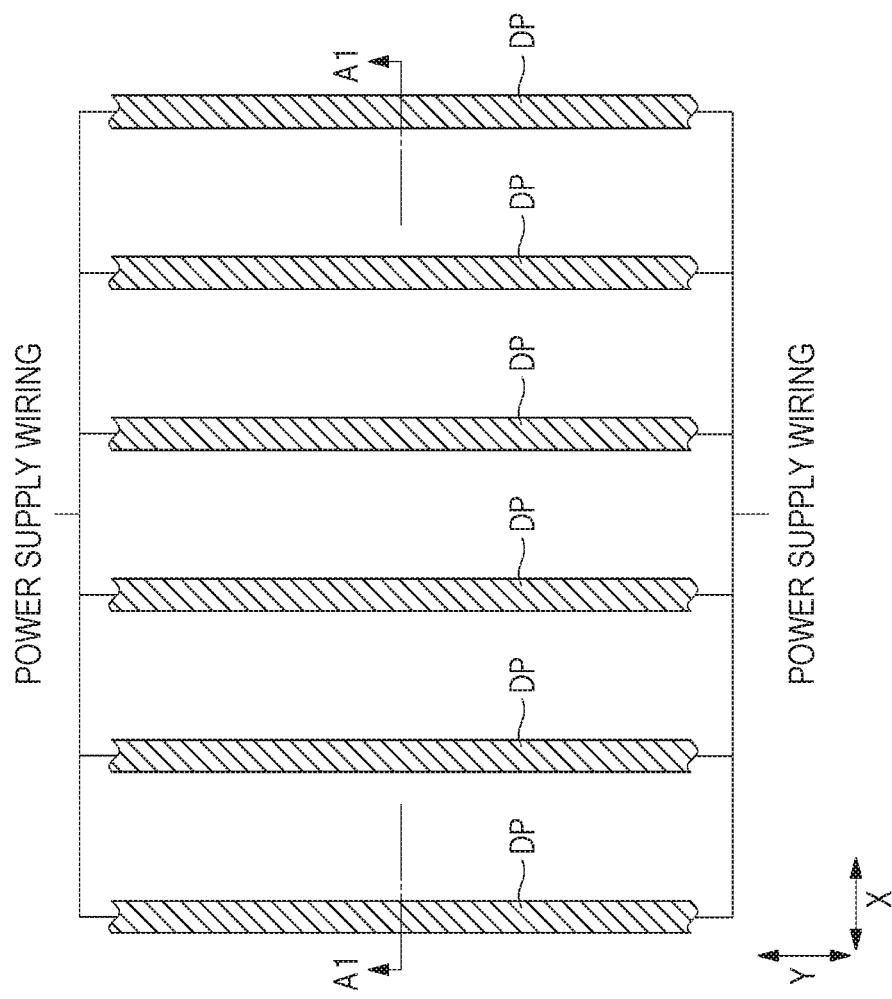
FIG. 9 is a plan view showing the power supply wiring applying the first technique.
Figure 10:
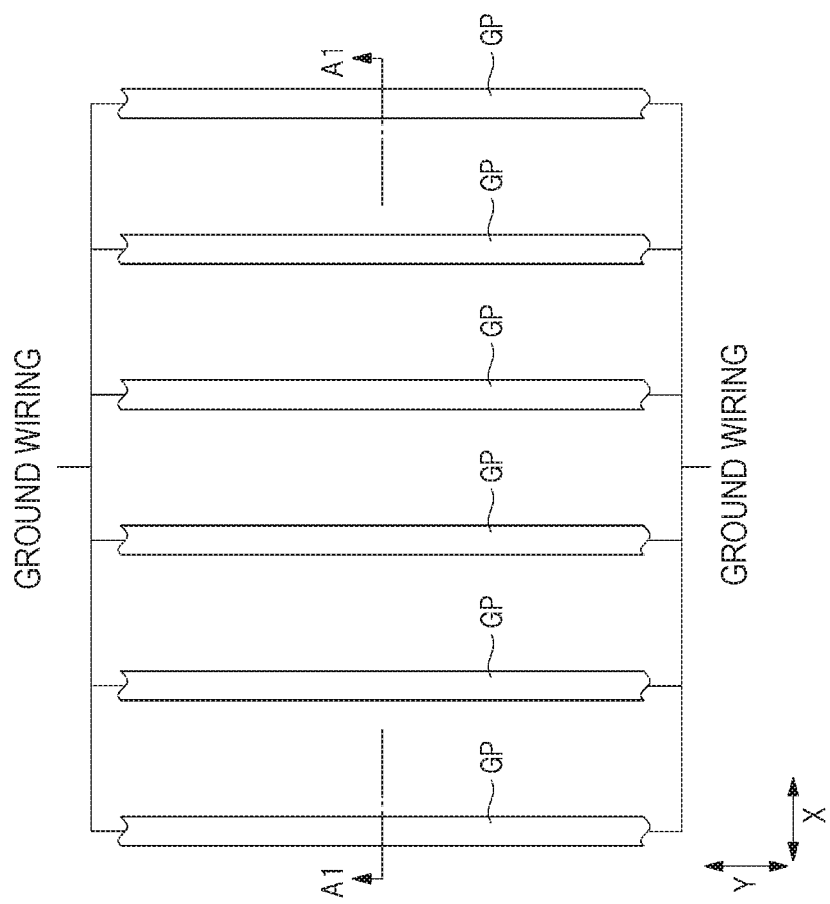
FIG. 10 is a plan view showing the ground wiring applying the first technique.
Figure 11:
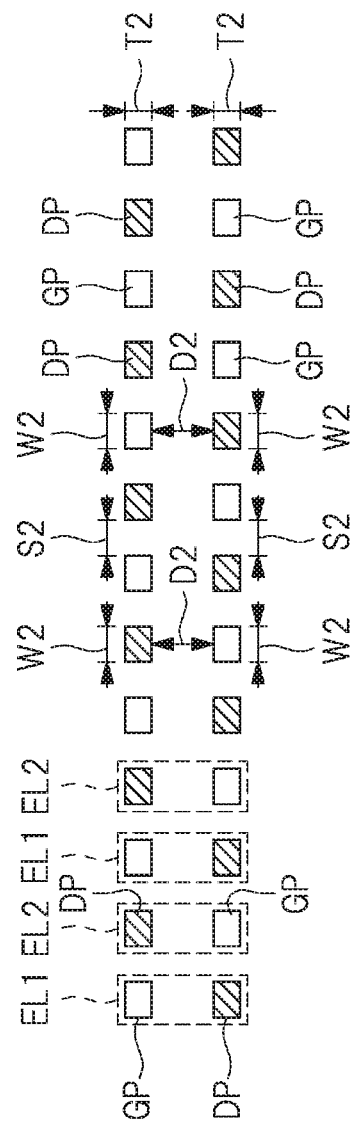
FIG. 11 is a cross-sectional view showing power supply and ground wirings applying a second technique.
Figure 12:
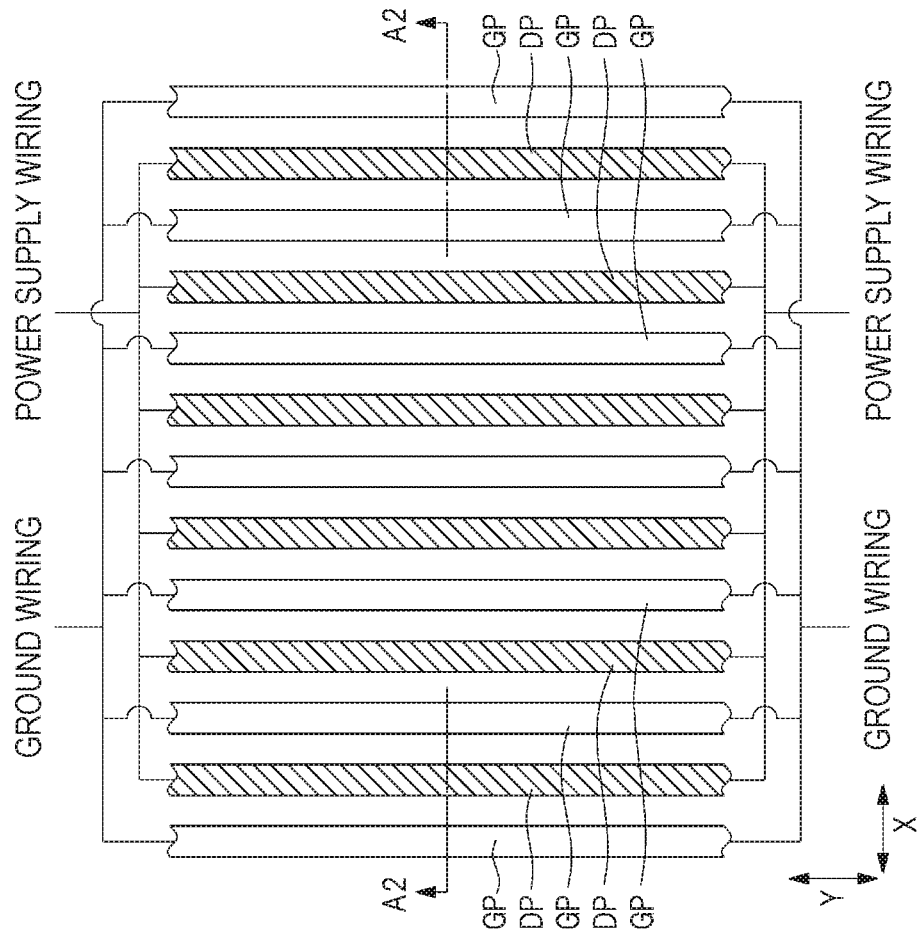
FIG. 12 is a plan view showing the power supply and ground wirings applying the second technique.
Figure 13:
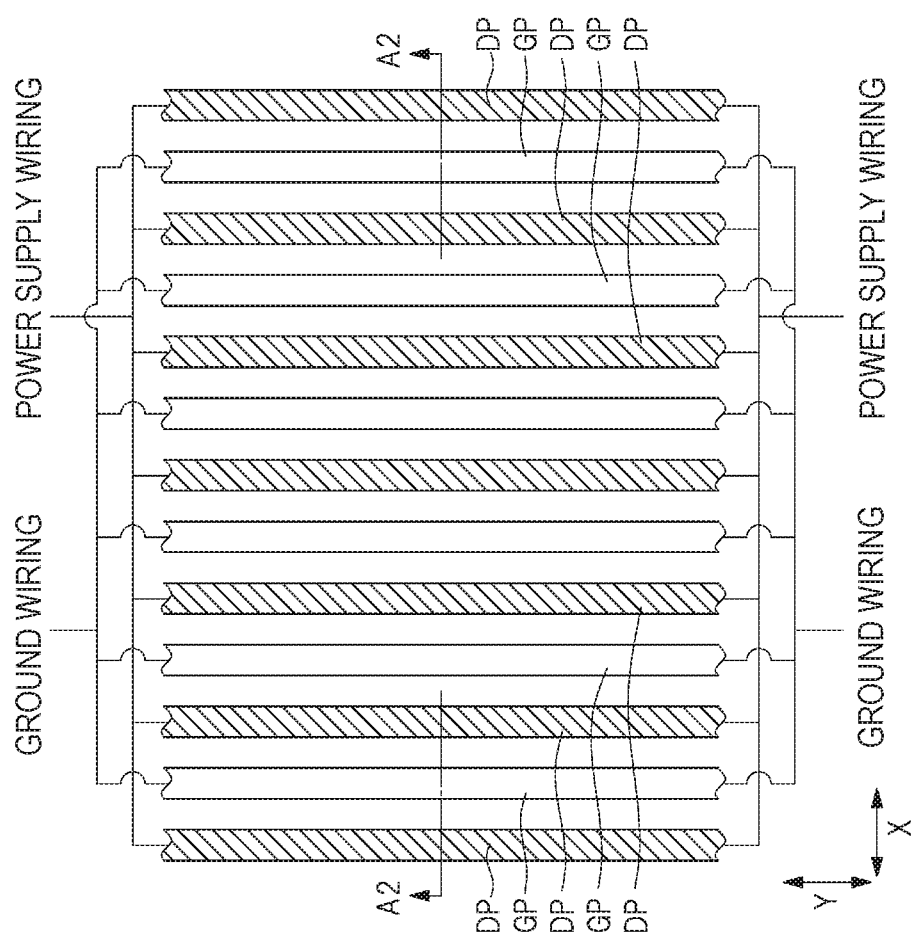
FIG. 13 is a plan view showing the power supply and ground wirings applying the second technique.

FIG. 8 is, in the wiring board, a cross-sectional view showing power first supply and ground wirings applying technique (design concept). FIG. 9 and FIG. 10 are, in the wiring substrate, a plan view showing power supply or ground wirings applying the first technique. The cross-sectional view at the position of A1-A1 lines in FIGS. 9 and 10 approximately corresponds to FIG. 8, FIG. 9 shows the wiring layer in which the power supply pattern DP is formed in the wiring substrate. FIG. 10 shows a wiring layer located one layer below the wiring layer shown in FIG. 9. Namely, the wiring layer in which the ground pattern GP is formed is shown. FIG. 11 is in the wiring substrate, a cross-sectional view showing power supply and ground wirings applying a second technique (design concept). Also, FIGS. 12 and 13 are, in the wiring substrate, a plan view showing the power supply and ground wirings applying the second technique. The cross-sectional view at the position of A2-A2 line in FIGS. 12 and 13 approximately corresponds to FIG. 11. FIG. 12 shows the wiring layer in which the power supply pattern DP of the micro-element EL1 and the ground pattern GP of the micro-element EL2 are formed in the wiring substrate. FIG. 13 shows a wiring layer located one layer below the wiring shown in FIG. 12. Namely, the wiring layer in which the ground pattern GP of the micro-element EL1 and the power supply pattern DP of the micro-element EL2 is formed is shown. Further, in FIGS. 8 to 13, a wiring (here, power supply pattern DP) to which the power supply voltage is applied (supplied) is hatched diagonal, while a wiring (here, ground pattern GP) to which the ground potential is applied (supplied) is omitted hatching, so as to be easy to distinguish between the power supply wiring and the ground wiring.

First, referring to FIGS. 8 to 10, in the wiring substrate, the power supply wiring and ground wiring applying the first technique will be described.

In the first technique, a parallel-plate (power supply and ground planes pair) is replaced by an aggregate of a plurality (a number) of micro-element EL1. Place the micro-element EL1 so that the sum of the plurality of micro-element EL1 is smaller than the width of the parallel-plate (power supply and ground planes pair). Micro-element (laminated structure) EL1 corresponds to those obtained by decomposing a parallel plate (power supply and ground planes pair), a line-shaped ground pattern GP of fine width, a laminated structure including a line-shaped power supply pattern DP of fine width. However, between the ground pattern GP and the power supply pattern DP, the insulator layer (the insulator layer constituting the wiring substrate) is interposed, through the insulator layer, the ground pattern GP and the power supply pattern DP are opposed to each other. The ground pattern GP and the power supply pattern DP are not in contact with each other, and are not connected to each other via a conductor. In cross-sectional view, each power supply pattern DP is surrounded by an insulator around, also, each ground pattern GP is surrounded by an insulator around. The micro-element EL1, i.e., the ground pattern GP and the power supply pattern DP constituting the micro-element EL1 extends in the Y direction, the micro-element EL1 extending in the Y direction are arranged in a plurality side by side in the X direction at predetermined intervals. In other words, the laminated structure including the ground pattern GP and the power supply pattern DP (micro-element EL1) is repeated a plurality in the X direction at predetermined intervals. Therefore, the power supply pattern DP extending in the Y direction is arranged in a plurality side by side in the X direction at predetermined intervals, and the ground pattern GP extending in the Y direction is arranged in a plurality side by side in the X direction at predetermined intervals. If the electric current flows through the power supply pattern DP or the ground pattern GP extending in the Y direction, the current direction (the direction in which the electric current flows) is the Y direction. In the wiring substrate, the ground pattern GP of the plurality of micro-element EL1 aligned in the X direction is formed in the same wiring layer, also, the power supply pattern DP of the plurality of micro-element EL1 aligned in the X direction is formed in the same wiring layer. Wiring layer power supply pattern DP is formed is one upper wiring layer than the wiring layer in which the ground pattern GP is formed, or one lower wiring layer. In the cases of FIGS. 8 to 10, although the wiring layer on which the power supply pattern DP is formed is shown to be a wiring layer one above the wiring layer on which the ground pattern GP is formed, it is also possible to replace the upper and lower power supply pattern DP and the ground pattern GP in all of the micro-element EL1. In that case, the wiring layer in which the power supply pattern DP is formed is one lower wiring layer than the wiring layer in which the ground pattern GP is formed.

Here, the X and Y directions are directions that intersect each other, and more specifically are directions that are orthogonal to each other, shown in FIGS. 9, 10, 12 and 13, and the like. Further, for the components of the wiring substrate, when referring to the X direction and Y direction, the X direction and Y direction is a direction substantially parallel to the main surface of the wiring substrate (upper surface or lower surface).

The power supply patterns DPs of a plurality of micro-element EL1 arranged in the X direction are connected in parallel. For example, the power supply pattern DP of the plurality of micro-element EL1 aligned in the X direction, connected to each other at one end of the extending direction of the power supply pattern DP (here Y direction) (electrically connected), also connected to each other at the other end of the extending direction of the power supply pattern DP (here Y direction) (electrically connected). The ground pattern GP of a plurality of micro-element EL1 arranged in the X direction is connected in parallel. For example, the ground pattern GP to each other of the plurality of micro-element EL1 aligned in the X direction is connected to each other (electrically connected) at one end of the extending direction of the ground pattern GP (here Y direction), also the other end of the extending direction of the ground pattern GP (here Y direction) it is connected to each other (electrically connected).

Although FIGS. 8 to 10 also show the case where two wiring layers are used, the case where three wiring layers are used is as follows. That is, in the respective micro-element EL1 shown in FIG. 8, placing a ground pattern similar to the ground pattern GP on the power supply pattern DP. Ground pattern on the power supply pattern DP is formed in the wiring layer one above the wiring layer power supply pattern DP is formed. Thus, the micro-element EL1, and the ground pattern GP, and the power supply pattern DP thereon, will include a ground pattern thereon, the micro-element EL1 will be a plurality arranged in the X direction at predetermined intervals. This structure corresponds to the structure shown in the lower side of FIG. 7. Again, in all the micro-element EL1, it is also possible to replace the power supply pattern and the ground pattern. It is also possible to use four or more wiring layers. That is, the power supply pattern DP shown in FIG. 9, and the ground pattern GP to be 10, by stacking alternately, using any number of wiring layers, it is possible to form a power supply wiring and ground wiring applying the first technique. In any case, in each micro-element EL1, the ground pattern GP and the power supply pattern DP are stacked alternately, the number of patterns to be stacked is the same as the number of wiring layers to be used.

Referring now to FIGS. 11 to 13, in the wiring substrate, the power supply wiring and ground wiring applying the second technique will be described.

In the second technique, a parallel-plate (power supply and ground planes pair) is replaced by an aggregate of a plurality (a number) of micro-element EL1, EL2. The second technique (FIGS. 11 to 13) differs from the first technique (FIGS. 8 to 10) in the following points.

That is, in the first technique (FIGS. 8 to 10), the structures of a plurality of micro-elements EL1 arranged in the X direction are basically the same. That is, the adjacent micro-element EL1 to each other, the power supply pattern DP is disposed in the same layer (the same wiring layer), also, the adjacent micro-element EL1 to each other, the ground pattern GP is disposed in the same layer (the same wiring layer).

In contrast, in the second technique (FIGS. 11-13), the micro-element (laminated structure) EL1 and the micro-element (laminated structure) EL2 are alternately arranged in the X direction at predetermined intervals. The structures of the micro-element EL1 are substantially the same as those of the second technique (FIGS. 11 to 13) and the first technique (FIGS. 8 to 10). The micro-element EL2 corresponds to (replaced) one in which the power supply pattern DP and the ground pattern GP are interchanged in the micro-element EL1. Therefore, in the micro-element EL1, if the power supply pattern DP is arranged in the lower layer ground pattern GP in the upper layer, in the micro-element EL2, the power supply pattern DP is arranged in the upper layer ground pattern GP in the lower layer. Therefore, a laminated structure including a ground pattern GP and the power supply pattern DP (micro-element EL1), the laminated structure and a laminated structure obtained by replacing the ground pattern GP and the power supply pattern DP (micro-element EL2) is repeated a plurality in the X direction at predetermined intervals. For this reason, in the second technique (FIGS. 11-13), the micro-element EL1 extending in the Y direction and the micro-element EL2 extending in the Y direction are adjacent to each other in the X direction. In the micro-element EL1 and the micro-element EL2 adjacent, the ground pattern GP of the power supply pattern DP and the micro-element EL2 of the micro-element EL1 are arranged in the same layer (the same wiring layer), also, the ground pattern GP of the micro-element EL1 and the power supply pattern DP of the micro-element EL2 are arranged in the same layer (the same wiring layer).

In the second technique (FIGS. 11-13), the power supply patterns DPs of the plurality of micro-element EL1, EL2 are connected in parallel. For example, the power supply patterns DP of the plurality of micro-element EL1, EL2 are electrically connected to each other at one end of the extending direction of the power supply pattern DP (here Y direction), also the other end of the extending direction of the power supply pattern DP (here Y direction) It is electrically connected to each other. The ground patterns GPs of the plurality of micro-elements EL1, EL2 are connected in parallel. For example, the ground pattern GP to each other of the plurality of micro-element EL1, EL2 is electrically connected to each other at one end of the extending direction of the ground pattern GP (here Y direction), also the other end of the extending direction of the ground pattern GP (here Y direction) It is electrically connected to each other.

In addition, the first technique (FIGS. 8 to 13) and the second technique (FIGS. 11 to 13) differ in the interval of the adjacent micro-elements. Specifically, in the first technique (FIGS. 8 to 10), it is preferable that the interval between adjacent micro-elements EL1 is large to some extent, whereas in the second technique (FIGS. 11 to 13), it is preferable that the interval between adjacent micro-elements EL1, EL2 is small to some extent. Reflecting this, the spacing of the adjacent micro-element EL1, EL2 in the second technique (FIGS. 11-13) is smaller than the spacing of the micro-element EL1 in the first technique (FIGS. 8-10).

The width of the micro-element EL1 in the first technique and the width of each of the micro-element EL1, EL2 in the second technique must be sufficiently small to be regarded as a concentrated constant element and ineffective as a parallel-plate. A specific width value will be described later.

In the first technique (FIGS. 8 to 10), as described with reference to FIGS. 6 and 7, the neighboring micro-element EL1 show positive mutual inductances, but the interval of the neighboring micro-element EL1 is increased to some extent, so that the magnetic field interaction between the neighboring micro-element EL1 is reduced. Therefore, as described with reference to FIGS. 6 and 7, when comparing the structure of the parallel plate (power supply and ground planes pair) and the structure of the first technique (FIGS. 8-10), the rate of increase in inductance is considerably smaller than the rate of increase in resistance. Thus, when the structure of the first technique (FIGS. 8 to 10) is employed, as compared with the case of employing the structure of the parallel plate (power supply and ground planes pair), it is possible to reduce the L/R ratio described above (time constant L/R). Therefore, the first technique (FIGS. 8 to 10) is a technique idea of reducing the L/R ratio (time constant L/R) by forming the power supply wiring and the ground wiring by a plurality of (a number) of micro-element EL1 connected in parallel and increasing the interval of the micro-element EL1 so that the magnetic field interaction between the adjacent micro-element EL1 is reduced. That is, the interval of adjacent micro-element EL1 is increased to reduce (close to zero) the magnetic field interaction between adjacent micro-element EL1.

On the other hand, in the second technique (FIGS. 11 to 13), a replacement of the power supply pattern DP and the ground pattern GP in the micro-element EL1 corresponds to the micro-element EL1, and the micro-element EL1 and the micro-element EL2 are adjacent to each other. Therefore, the magnetic field generated by the micro-element EL1 and the magnetic field generated by the neighboring micro-element EL2 are in the same direction and are coupled to each other, so that the micro-element EL1 and the neighboring micro-element EL2 exhibit negative mutual inductances. Therefore, if the total number of micro-element EL1, EL2 of the second technique (FIGS. 11 to 13) and the total number of micro-element EL1 of the first technique (FIGS. 8 to 10) are the same, the second technique (FIGS. 11 to 13) can further reduce the inductance (parallel combined inductance) than the first technique (FIGS. 8 to 10). This is because, in the case of the first technique (FIGS. 8 to 10), the neighboring micro-element EL1 show positive mutual inductance, while in the case of the second technique (FIGS. 11 to 13), the neighboring micro-element EL1, EL2 show negative mutual inductance. In the second technique (FIGS. 11 to 13), in order to reduce the parallel combined inductance of a plurality of micro-element EL1, EL2, the stronger the magnetic field interaction between adjacent micro-element EL1, EL2, the smaller the interval between adjacent micro-element EL1, EL2 is sufficient. In the second technique (FIGS. 11-13), by reducing the interval of adjacent micro-element EL1, EL2, it is possible to increase the magnetic field interaction (negative mutual inductance) between adjacent micro-element EL1, thereby further reducing the inductance (parallel combined inductance). Thus, when the structure of the second technique (FIGS. 11 to 13) is employed, it is possible to further reduce the L/R ratio described above (time constant L/R) as compared with the case where the structure of the parallel plate (power supply and ground planes pair) or the case where the first technique is employed. Therefore, the second technique, to form a power supply wiring and ground wiring by a plurality of (large number) of micro-element EL1, EL2 connected in parallel, the interval of the micro-element EL1, EL2 so that the magnetic field interaction between the adjacent micro-element EL1, EL2 is increased by reducing, a technical concept of reducing the L/R ratio (time constant L/R). Therefore, the arrangement density of the micro-element EL1 in the first technique (FIGS. 8 to 10) is low density (sparse), and the arrangement density of the micro-element EL1, EL2 in the second technique (FIGS. 11 to 13) is high density.

Although FIGS. 11 to 13 also show the case where two wiring layers are used, the case where three wiring layers are used is as follows. That is, in each of the micro-element EL1 shown in FIG. 11, to place the ground pattern GP and the same ground pattern below the power supply pattern DP, and, in each of the micro-element EL2 shown in FIG. 11, the power supply pattern DP and the same ground pattern below the ground pattern GP to place. This micro-element EL1 and the micro-element EL2 will be arranged alternately in the X direction at predetermined intervals. This structure corresponds to the structure shown in the lower side of FIG. 15 described later. It is also possible to use four or more wiring layers. That is, the power supply pattern DP and the ground pattern GP shown in FIG. 12, and the power supply pattern DP and the ground pattern GP shown in FIG. 13, by stacking alternately, using any number of wiring layers, it is possible to form a power supply wiring and ground wiring applying a second technique. In any case, in each micro-element EL1, EL2, the ground pattern GP and the power supply pattern DP are stacked alternately, the number of patterns to be stacked is the same as the number of wiring layers to be used, the micro-element EL2, the power supply pattern DP and the ground pattern GP in the micro-element EL1 It corresponds to those replaced.

In both the first and second arts, the L/R ratio can be reduced as compared to employing parallel plates (power supply and ground planes pairs). Incidentally, the first technique is mainly a technique for reducing the L/R ratio by increasing the resistance, whereas the second technique is mainly a technique for reducing the L/R ratio by lowering the inductance.

Therefore, when employing a parallel plate (power supply and ground planes pair), whereas showing the impedance frequency response characteristics indicated by a solid line in FIG. 4 above, when employing the first technique, and when employing the second technique will show the impedance frequency response characteristics indicated by a dotted line in FIG. 4. Further, when employing a parallel plate (power supply and ground planes pair), the time variation of the power supply voltage shows a time variation as indicated by a solid line in FIG. 5, when employing the first technique, and when employing the second technique, the time variation of the power supply voltage shows a time variation as indicated by a dotted line in FIG. 5. Therefore, as the power supply wiring and ground wiring, when employing the first technique, and when employing the second technique, it is possible to reduce the power supply fluctuation (fluctuation of the power supply voltage) during operation of the semiconductor chip (LSI). Therefore, it is possible to improve the performance of the electronic device or semiconductor device.

Next, various dimensions in the first technique (FIGS. 8 to 10) will be described.

Here, the width of the micro-element EL1 in the first technique (dimension in the X direction), i.e., the respective widths of the power supply pattern DP and the ground pattern GP constituting the micro-element EL1 (dimension in the X direction), reference numeral denotes a width W1. Further, the interval of the adjacent micro-element EL1 in the first technique (dimension in the X direction), referred to as the spacing S1 with reference numeral S1. Further, the respective thicknesses of the power supply pattern DP and the ground pattern GP constituting the micro-element EL1 in the first technique, referred to as a thickness T1 with reference numeral T1. The distance between the power supply pattern DP and the ground pattern GP constituting the micro-element EL1 in the first technique is referred to as a distance D1 with reference numeral D1. Interval D1 corresponds to the thickness of the insulator layer interposed between the power supply pattern DP and the ground pattern GP. Further, the electromagnetic wavelength corresponding to the maximum frequency of the power supply noise to be assumed, the wavelength lambda.

First, the width W1 of the micro-element EL1 must be small enough to be regarded as a narrow and concentrated constant element in addition to eliminating the properties of the parallel plates. From this point of view, the widths W1 of the micro-elements EL1 are reduced until $W1<D1\times2$ and $W1<\lambda/20$ are satisfied. Furthermore, the respective aspect ratios of the power supply pattern DP and the ground pattern GP constituting the micro-element EL1 (the ratio of the thickness T1 to the width W1, i.e., T1/W1), considering the forming process of the wiring layer of the wiring substrate, it is difficult to exceed 2. From this viewpoint, the widths W1 of the micro-elements EL1 are set so that $T1/W1 \leq 2$ is satisfied.

Therefore, with respect to the widths W1 of the micro-elements EL1, the following Formulas (1), (2) and (3) hold.

$$W1<D1\times2 \tag{1}$$

$$W1<\lambda/20 \tag{2}$$

$$W1 \geq T1/2 \tag{3}$$

where it is common to assume a wavelength of about 1 GHz. In this case, $\lambda/20$ is about 7.5 mm. The interval D1 between the power supply pattern DP and the ground pattern GP corresponds to the thickness of the insulator layer interposed between the power supply pattern DP and the ground pattern GP, and when the interval D1 is smaller than 15 mm (i.e., when D1×2 is smaller than 7.5 mm), if the above formula is satisfied, the above Formula (2) is necessarily satisfied. The thickness of each insulator layer of the wiring substrate used for semiconductor device is sufficiently smaller than 15 mm, therefore, the interval D1 between the power supply pattern DP and the ground pattern GP is less than 15 mm. Therefore, if the wiring substrate (PB1, PB2) used for semiconductor device satisfies Formula (1) above, it inevitably satisfies Formula (2) above. For this reason, the requirements for defining the widths W1 of the micro-element EL1 are the above-mentioned Formulas (1) and (3). Summarizing Formula 1 and Formula (3) above, the following Formula (4) holds for the widths W1 of the micro-element EL1.

$$T1/2 \leq W1 < D1\times2 \tag{4}$$

Next, in the first technique, as described above, the magnetic field interaction between the adjacent micro-element EL1 is sufficiently weak, and the width of the entire micro-element EL1 arranged plurality (layout width) is as small as possible desirable. The larger the interval S1 of neighboring micro-element EL1, the weaker the magnetic field interaction between neighboring micro-element EL1. Therefore, in order to weaken the magnetic field interaction between the adjacent micro-elements EL1, it is desirable that the interval S1 between the adjacent micro-elements EL1 is larger than twice the interval D1 between the power supply pattern DP and the ground pattern GP (i.e., S1>D1×2) However, according to the empirical rule when the relative permeability of the insulator surrounding the periphery of the micro-element EL1 is about 1, when the spacing S1 of the adjacent micro-element EL1 exceeds five times the spacing D1 of the power supply pattern DP and the ground pattern GP, the reduction of the magnetic field interaction between adjacent micro-element EL1 converges. Then, even if the interval S1 is made larger than five times the spacing D1, the magnetic field interaction between neighboring micro-element EL1 is hardly changed (becomes nearly zero and converges). Further, if the relative permeability of the insulator surrounding the periphery of the micro-element EL1 is greater than 1, due to the concentrated action of the magnetic field, the spacing S1 of the adjacent micro-element EL1, when it reaches a predetermined value smaller than five times the spacing D1 of the power supply pattern DP and the ground pattern GP, the reduction of the magnetic field interaction between the adjacent micro-element EL1 converges, even further increasing the spacing S1, the magnetic field interaction is hardly changed. Therefore, in order to weaken the magnetic field interaction between the adjacent micro-element EL1, it is not required to increase the interval S1 of the adjacent micro-element EL1 than five times the spacing D1 of the power supply pattern DP and the ground pattern GP. Increasing the distance S1 to be larger than five times the distance D1 is disadvantageous in view of increasing the width of the entire micro-element EL1 arranged in a plurality of rows. Therefore, it is preferable that the interval S1 between adjacent micro-elements EL1 is not larger than five times the interval D1 between the power supply pattern DP and the ground pattern GP, i.e., S1≤D1×5.

Therefore, the following Formula (5) holds for the distance S1 between adjacent micro-elements EL1.

$$D1\times 2 < S1 \leq D1 \times 5 \quad (5)$$

For this reason, in the case of the first technique (FIGS. 8 to 10), Formula (4) and Formula (5) may be established. That is, it is desirable to arrange a plurality of micro-elements EL1 so that the following Formula (6), which is a combination of Formulas (4) and (5), is satisfied.

$$T1/2 \leq W1 < D1\times 2 \text{ and } D1\times 2 < S1 \leq D1\times 5 \quad (6)$$

Next, the various dimensions in the second technique (FIGS. 11 to 13) will be described below.

Here, the respective widths of the micro-element EL1, EL2 in the second technique (dimension in the X direction), i.e., the respective widths of the power supply pattern DP and the ground pattern GP constituting the micro-element EL1, EL2 (dimension in the X direction), reference numeral W2 denotes a width W2. Further, the interval of the adjacent micro-element EL1, EL2 in the second technique (dimension in the X direction), referred to as the spacing S2 with reference numeral S2. Further, the respective thicknesses of the power supply pattern DP and the ground pattern GP constituting the micro-element EL1, EL2 in the second technique, referred to as a thickness T2 with reference numeral T2. The distance between the power supply pattern DP and the ground pattern GP constituting the micro-element EL2 in the second technique is referred to as a distance P2 with reference numeral D2. Spacing P2 corresponds to the thickness of the insulator layer interposed between the power supply pattern PP and the ground pattern GP. Further, the electromagnetic wavelength corresponding to the maximum frequency of the power supply noise to be assumed, the wavelength lambda.

First, the widths W1 of the micro-elements EL1, EL2 are the same as those of the first technique in the case of the second technique. Therefore, with respect to the widths W1 and W2 of the micro-element EL1, for the same reason as in the case of the first technique, in the case of the second technique, the following Formulas (7), (8), and (9) corresponding to the above Formulas (1), (2), and (3), respectively, hold.

$$W2 < D2 \times 2 \quad (7)$$

$$W2 < \lambda/20 \quad (8)$$

$$W2 \geq T2/2 \quad (9)$$

As with the first technique of Formula (9), the second technique will inevitably satisfy Formula (8) above if Formula (7) is satisfied. Therefore, as requirements for defining the width W2 of the micro-element EL1, EL2, the above-mentioned Formulas (7) and (9) are required, and when the above-mentioned Formulas (7) and (9) are summarized, the following Formula (10) corresponding to the above-mentioned Formula (4) is satisfied for the width W2 of the micro-element EL1, EL2.

$$T2/2 \leq W2 < D2 \times 2 \quad (10)$$

Next, in the case of the second technique, unlike the case of the first technique, it is desirable that the magnetic field interaction between the adjacent micro-element EL1, EL2 becomes strong. The smaller the interval S2 of neighboring micro-element EL1, EL2, the stronger the magnetic field interaction between neighboring micro-element EL1. Therefore, in order to enhance the magnetic field interaction between the adjacent micro-element EL1, EL2, the interval S2 of the adjacent micro-element EL1, EL2 is preferably smaller than twice the spacing D2 of the power supply pattern DP and the ground pattern GP. Therefore, the following Formula (11) holds.

$$S2 < D2 \times 2 \quad (11)$$

However, when too small the interval S2, since the total volume of the conductors is increased, in the aggregate of a plurality of micro-element EL1, EL2, the inductance is lowered, the resistor also decreases, the L/R ratio (time constant L/R) it becomes impossible to obtain the effect of reducing the. The main purpose of adopting the second technique, since it is to lower the L/R ratio, as compared with the case of the parallel plate (power supply and ground planes pair), the case of the second technique, the resistance (resistance of the power supply wiring and the ground wiring) is reduced, it is necessary to prevent.

Here, in each of the micro-element EL1, EL2, if the electric current flows, mainly because the electric current flows near the surface of the conductor (here the power supply pattern DP and the ground pattern GP), as the total area of the surface of the conductor is increased, the resistor is reduced.

Therefore, the sum of the surface area of the power supply pattern DP of all the micro-element EL1, EL2 and the surface area of the power supply pattern DP in the case of the second technique does not exceed the surface area of the power supply plane in the case of parallel plates (power supply and ground planes pair) and the surface area of the ground plane. In other words, in the cross-sectional view (cross-section substantially perpendicular to the Y direction is the current direction), i.e. in FIG. 11, the sum of the circumferential length of the power supply pattern DP of the micro-element EL1, EL2 and the circumferential length of the ground pattern GP is equal to or less than the circumferential length of the power supply plane and the ground plane in the case of parallel plates (power supply and ground planes pair). To satisfy this condition, the respective thicknesses T2 of the power supply pattern DP and the ground pattern GP, may be the interval S2 or less (i.e. T2≤S2) of the micro-element EL1, EL2 adjacent, the following Formula (12) holds.

$$T2 \leq S2 \tag{12}$$

Why the above Formula (12) holds is as follows. That is, in the cross section of FIG. 11, the outer peripheral length of one power supply pattern DP is (W2+T2)×2, assuming that the array total number of the micro-element EL1, EL2 is n, the power supply pattern DP is n since there, the sum of the outer peripheral length of the n power supply pattern DP, (W2+T2)×2n. On the other hand, assuming a power supply plane having the same external dimensions as when the total number of arrays of the micro-element EL1, EL2 is n, the width of upper surface of the power supply plane (dimension in the X direction) and the width of the lower surface (dimension in the X direction) are both W2×n+S2×(n−1), since the length of the two sides of the power supply plane corresponds to T2, respectively, the outer peripheral length of the power supply plane is W2×2n+S2×2(n−1)+T2×2. Therefore, if the sum of the outer circumferential lengths of the n power supply patterns DP is equal to or less than the outer circumferential length of the power supply plane, that is, if the following Formula (13) holds, the resistor of the power supply wiring in the case of the second technique becomes equal to or greater than the resistance of the power supply plane of the equivalent outer dimensions.

$$(W2+T2) \times 2n \leq W2 \times 2n + S2 \times 2(n-1) + T2 \times 2 \tag{13}$$

Solving the above Formula (13) leads to the above Formula (12) Thus, if Formula (12) above holds, the resistor of the power supply wiring in the case of the second technique will be greater than or equal to the resistance of the power supply plane of equivalent external dimensions. Therefore, by setting the interval S2 of the micro-element EL1, EL2 adjacent so that the above Formula (12) holds, to prevent the resistor is smaller than that of the parallel plate (power supply and ground planes pair), L/R ratio (time constant L/R) easily obtain the effect of reducing.

Therefore, the following Formula (14) is satisfied with respect to the interval S2 between adjacent micro-elements EL1, EL2 from the above Formulas (11) and (12).

$$T2 \leq S2 < D2 \times 2 \tag{14}$$

For this reason, in the case of the second technique, the above-mentioned Formulas (10) and (14) are satisfied. That is, a plurality of micro-elements EL1, EL2 are arranged so that the following Formula (15), which is a combination of Formulas (10) and (14), is satisfied.

$$T2/2 \leq W2 < D2 \times 2 \text{ and } T2 \leq S2 < D2 \times 2 \tag{15}$$

In the case of the first technique, arranging a plurality of micro-element EL1 so that the above Formula (6) holds, also, in the case of the second technique, by arranging a plurality of micro-element EL1, EL2 so that the above Formula (15) holds, as compared with the case of the parallel plate (power supply and ground planes pair), it is possible to accurately reduce the L/R ratio described above (time constant L/R). Thus, it is possible to reduce the power supply fluctuation during operation of the semiconductor chip (LSI).

As for the parameters (W12, S1, S2, T1, T2, D1, D2) applied to the above formulas, the mean values of the values measured at a plurality of points (about several points, for example, about 5 points) in the wiring substrate can be used. Also, for the first technique, in the respective micro-element EL1, the power supply pattern DP and the ground pattern GP may be offset from each other in the X direction. Further, in the second technique, in the respective micro-element EL1, EL2, the power supply pattern DP and the ground pattern GP may be offset from each other in the X direction. Even in such a case, an effect of reducing the above-mentioned L/R ratio (time constant L/R) can be obtained as compared with the case of the parallel plate (power supply and ground planes pair). However, in order to further reduce the L/R ratio (time constant L/R), the deviation in the X direction between the power supply pattern DP and the ground pattern GP in each micro-element (EL1, EL2) is advantageously reduced as much as possible. Because, by reducing the deviation in the X direction between the power supply pattern DP and the ground pattern GP in each micro-element (EL1, EL2), since the interval between the power supply pattern DP and the ground pattern GP in each micro-element (EL1, EL2) (distance) can be shortened, since the L/R ratio is likely to be small. Therefore, in the first technique, it is preferable that the power supply pattern DP and the ground pattern GP overlap each other in the respective micro-elements EL1 in plan view. Further, if the second technique, in the respective micro-element EL1, EL2, it is preferable that the power supply pattern DP and the ground pattern GP overlap view.

<Application Example of First Technique and Second Technique>

Figure 14:
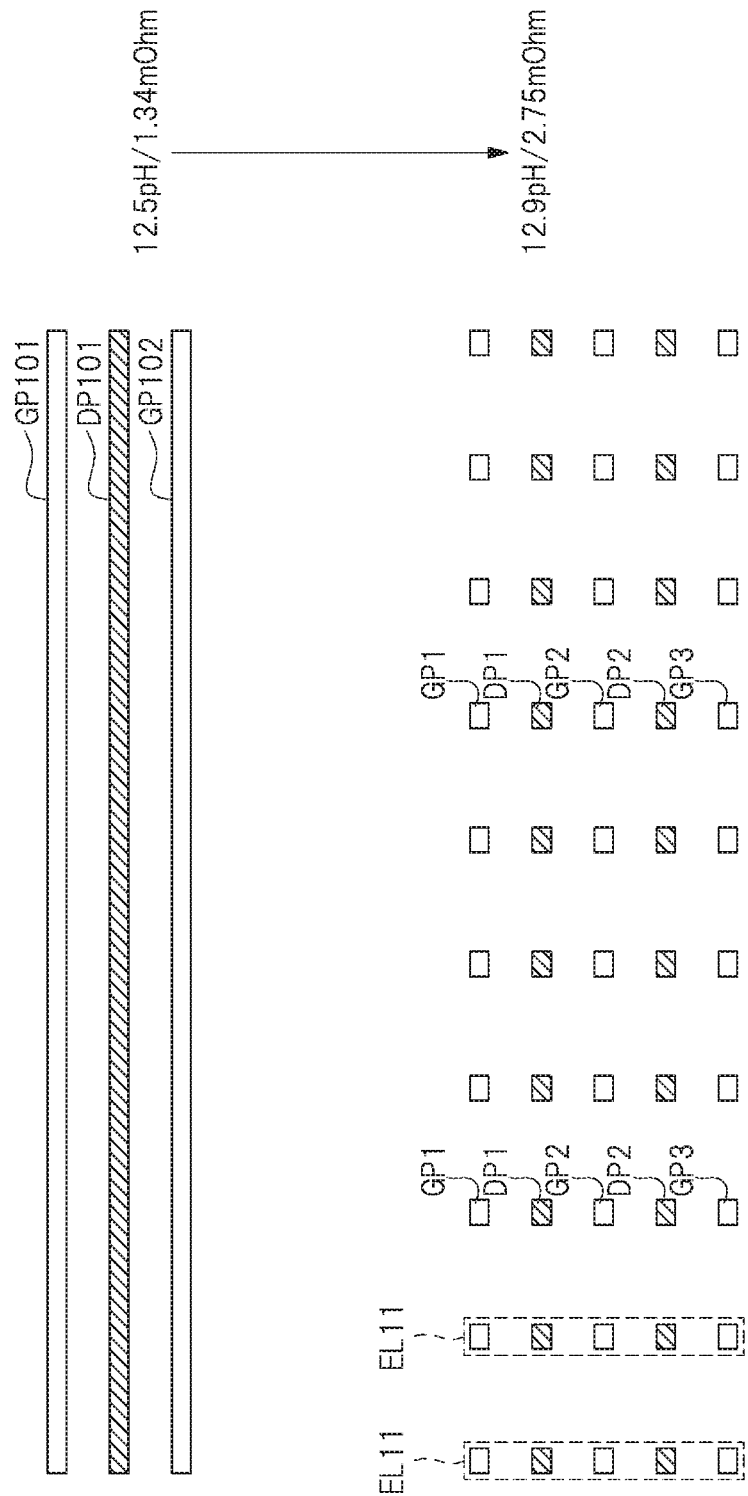
FIG. 14 is a cross-sectional view showing a power supply wiring of a wiring substrate and a ground wiring of the wiring substrate.

Next, the application example of the first Technique is explained with reference to FIG. 14, FIG. 14 is a cross-sectional view showing a power supply wiring of a wiring substrate and a ground wiring of the wiring substrate. Also, in FIG. 14, a wiring (power supply wiring) to which the power supply voltage is applied (supplied) is hatched diagonal, while a wiring (ground wiring) to which the ground potential is applied (supplied) is omitted hatching, so as to be easy to distinguish between the power supply wiring and the ground wiring.

The upper side of FIG. 14 shows the same structure as the upper side of FIG. 7. The structure shown in the lower side of FIG. 14 corresponds to the structure shown in the lower side of FIG. 7 in which the number of wiring layers is increased by two. That is, in the case shown in the lower side of FIG. 14, a line-shaped ground pattern GP1 fine width, a line-shaped power supply pattern DP1 of fine width, a line-shaped ground pattern GP2 of fine width, a line-shaped power supply pattern DP2 of fine width, a fine width of the line-shaped ground pattern GP2 micro-elements (laminated structure) EL11 consisting of a laminated structure of are shown cross-sectional view when connected in parallel by arranging a number at predetermined intervals. Note that the lower side of FIG. 14 has a structure satisfying the above Formula (6). Further, the interval between the power supply pattern and the ground pattern in the thickness direction (corresponding to the thickness of the insulator layer between the power supply pattern and the ground pattern) is set to 33 μm, each thickness of the power supply pattern and the ground pattern is assumed to be set to 15 μm. Then, the parallel combined inductance and the parallel combined resistance in the case of the structure shown in the lower side of FIG. 14, obtained by a two-dimensional electromagnetic field simulator, the results of comparison with the inductance and the resistance in the case of the structure shown in the upper side of FIG. 14 is also shown in FIG. 14.

In the case of the structure shown in the upper side of FIG. 14, the inductance was 12.5 pH: and the resistor was 1.34 mΩ, and in the case of the structure shown in the lower side of FIG. 14, the inductance (parallel composite inductance) was 12.9 pH and the resistance (parallel composite resistance) was 2.75 mΩ. Reflecting that increased the number of layers of the conductor in the structure shown in the lower side of FIG. 14, the inductance of the structure shown in the lower side of FIG. 14 (parallel combined inductance) is substantially the same as the inductance of the structure shown in the upper side of FIG. 14 but, the resistance of the structure shown in the lower side of FIG. 14 (parallel combined resistance) is about twice the resistance of the structure shown in the upper side of FIG. 14. Therefore, in the case of the structure shown in the lower side of FIG. 14, the above-mentioned L/R ratio (time constant L/R) becomes smaller, specifically 0.51 times, than in the case of the structure shown in the upper side of FIG. 14. Therefore, in the case of the structure shown in the lower side of FIG. 7 and the structure shown in the lower side of FIG. 14, it is possible to obtain the effect of reducing the variation of the power supply voltage during operation of the semiconductor chip (LSI) by becoming the above L/R ratio (time constant L/R) smaller, as compared with the case of the structure shown in the upper side of FIG. 14. Further, in the structure shown in the lower side of FIG. 7, even when the layout width of the entire array of the micro-element EL10 is doubled, it is possible to set the inductance (parallel combined inductance) that is substantially the same amount as the inductance of the structure shown in the upper side of FIG. 7. Structure applying the first technique to the power supply wiring and the ground wiring, when it is more important to increase the resistor than a decrease in inductance, or if there is a margin in the area of the region capable of arranging the structure applying the first technique (layout area), especially if there is a margin in the width of the region, it is suitable.

Figure 15:
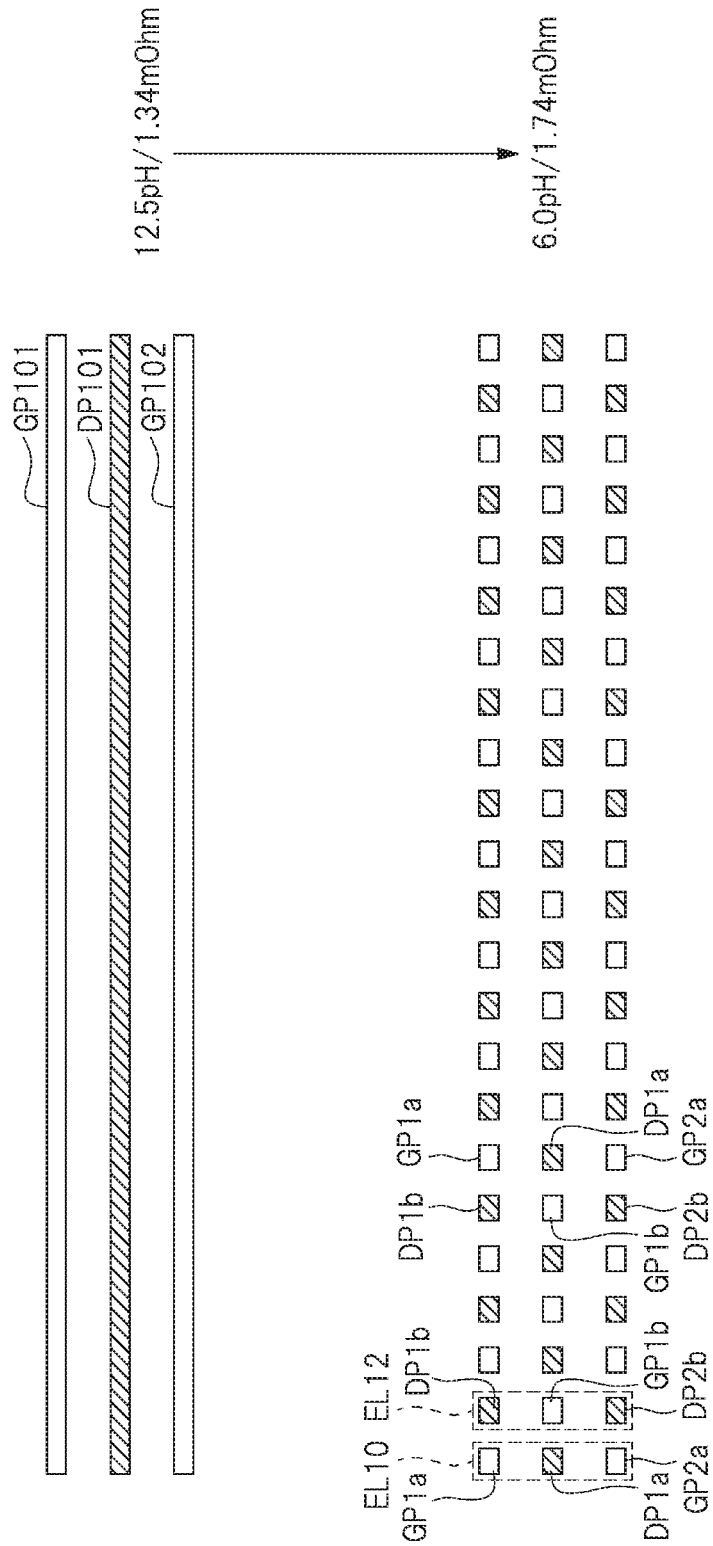
FIG. 15 is a cross-sectional view showing a power supply wiring of a wiring substrate and a ground wiring of the wiring substrate.

Next, an application example of the second technique will be described with reference to FIG. 15. FIG. 15 is a cross-sectional view showing a power supply wiring of a wiring substrate and a ground wiring of the wiring substrate. Also, in FIG. 15, a wiring (power supply wiring) to which the power supply voltage is applied (supplied) is hatched diagonal, while a wiring (ground wiring) to which the ground potential is applied (supplied) is omitted hatching, so as to be easy to distinguish between the power supply wiring and the ground wiring.

The upper side of FIG. 15 shows the same structure as the upper side of FIG. 7. The lower side of FIG. 15 corresponds to the configuration shown in the lower side of FIG. 7 in which every other micro-element EL10 is replaced with a micro-element EL12 and the interval between adjacent micro-elements EL10, EL12 is narrowed. The micro-element EL12 corresponds to the replacement of the power supply pattern and the ground pattern in the micro-element EL10. That is, in the case shown in the lower side of FIG. 15, a line-shaped ground pattern GP1$a$ of fine width, a line-shaped power supply pattern DP1$a$ of fine width, a micro-element made of a laminated structure of a line-shaped ground pattern GP2$a$ of fine width (laminated structure) EL10, a line-shaped power supply pattern DP1$b$ of fine width, a line-shaped ground pattern GP1$b$ of fine width, and a micro-element (laminated structure) EL12 made of a laminated structure of a line-shaped power supply pattern DP2$b$ of fine width, cross-sectional view when connected in parallel alternately in a number at predetermined intervals is shown. Note that the lower side of FIG. 15 has a structure satisfying the above Formula (15). Further, the interval between the power supply pattern and the ground pattern in the thickness direction (corresponding to the thickness of the insulator layer between the power supply pattern and the ground pattern in the thickness direction) is set to 33 μm, each thickness of the power supply pattern and the ground pattern is assumed to be set to 15 μm. Then, the parallel combined inductance and the parallel combined resistance in the case of the structure shown in the lower side of FIG. 15, obtained by a two-dimensional electromagnetic field simulator, the results of comparison with the inductance and the resistance in the case of the structure shown in the upper side of FIG. 15 is also shown in FIG. 15.

In the case of the structure shown in the upper side of FIG. 15, the inductance was 12.5 pH: and the resistor was 1.34 mΩ, and in the case of the structure shown in the lower side of FIG. 15, the inductance (parallel composite inductance) was 6.0 pH and the resistance (parallel composite resistance) was 1.74 mΩ. Therefore, in the case of the structure shown in the lower side of FIG. 15, as compared with the case of the structure shown in the upper side of FIG. 15, the L/R ratio described above becomes small, specifically 0.37 times. Therefore, as compared with the case of the structure shown in the upper side of FIG. 15, in the case of the structure shown in the lower side of FIG. 15, by reducing the L/R ratio described above (time constant L/R), the variation of the power supply voltage during operation of the semiconductor chip (LSI) it is possible to obtain the effect of reducing.

Looking at the breakdown of the decrease in the L/R ratio (time constant L/R) in the case of the structure shown in the lower side of FIG. 15, the inductance (parallel composite inductance) of the structure shown in the lower side of FIG. 15 is almost half of the inductance of the structure shown in the upper side of FIG. 15, but the resistor (parallel composite resistance) of the structure shown in the lower side of FIG. 15 does not increase much from the resistance of the structure shown in the upper side of FIG. 15 (increased by about 30%). To increase the resistor, it is effective to change the ratio of the width of the entire array of micro-element EL10, EL12 (dimension in the X direction) and the length (dimension in the Y direction).

As can be seen when comparing FIGS. 7, 14 and 15, in the case of the structure shown in the lower side of FIG. 15 applying the second technique, the above-described L/R ratio (time constant L/R) can be further reduced as compared with the case shown in the lower side of each of FIGS. 7 and 14 applying the first technique, thereby it is possible to obtain the effect of further reducing the power supply fluctuation (fluctuation of the power supply voltage) during operation of the semiconductor chip (LSI). Therefore, in order to further reduce the variation in the power supply voltage during operation of the semiconductor chip (LSI), it is advantageous when applying the second technique than the first technique. However, in the second technique, since it is difficult to increase the resistance (parallel combined resistance), if the resistance value control is more important than the inductance control, the width of the entire array of the micro-elements (dimension in the X direction) and the length (dimension in the Y direction) it is necessary to adjust the ratio of as appropriate.

In the structure shown in the lower side of FIG. 15, upper surface of the uppermost layer conductor, the lower surface of the lowermost conductor (corresponding to the ground pattern GP2a and the power supply pattern DP2b of the micro-element EL12 of the micro-element EL10), electrically conductor plane since it is the same, it can be used as a reference of the signal. The limitation is that 1/20 of the electromagnetic wavelength corresponding to the propagating signal frequency is not less than the interval of the micro-element EL10, EL12. Incidentally, the top layer conductors correspond to the ground pattern GP1a of the micro-element EL10 and the power supply pattern DP1b of the micro-element EL12. The lowest layer conductors also correspond to the ground pattern GP2a of the micro-element EL10 and the power supply pattern DP2b of the micro-element EL12. Assuming that the dielectric constant of the insulator layer between the conductors (power supply pattern and ground pattern) of the micro-element is 3.3, the range of the signal frequency satisfying the condition is 410 GHz or less. Normally, the signaling frequency used in semiconductor device is less than 410 GHz, so the above conditions are met. Therefore, so high speed, if not a high-frequency signal, in the structure shown in the lower side of FIG. 15, upper surface of the top layer conductor, the bottom surface of the lowermost conductor can be used as a reference of the signal.

Figure 16:
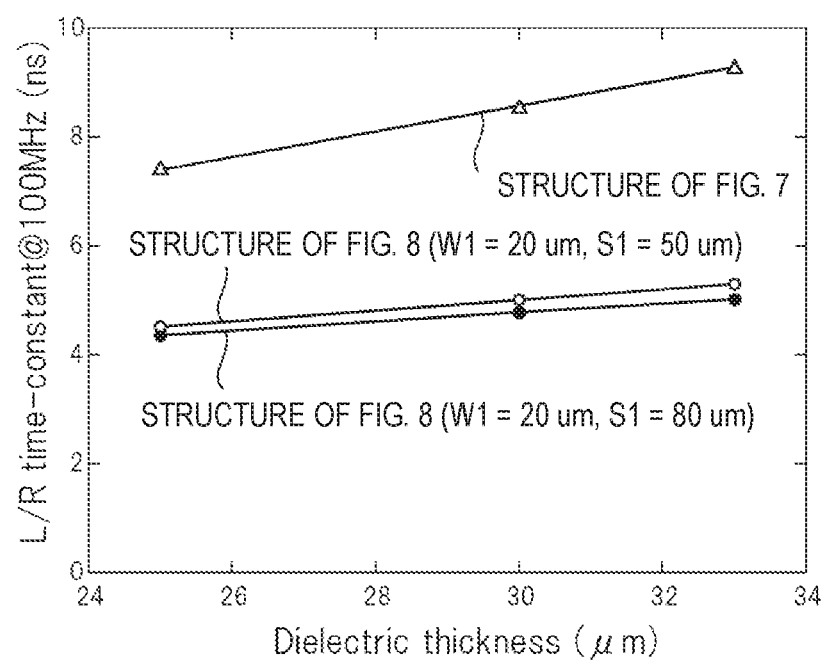
FIG. 16 is a graph showing a dependence of a time constant. L/R on a thickness of an insulating layer.
Figure 17:
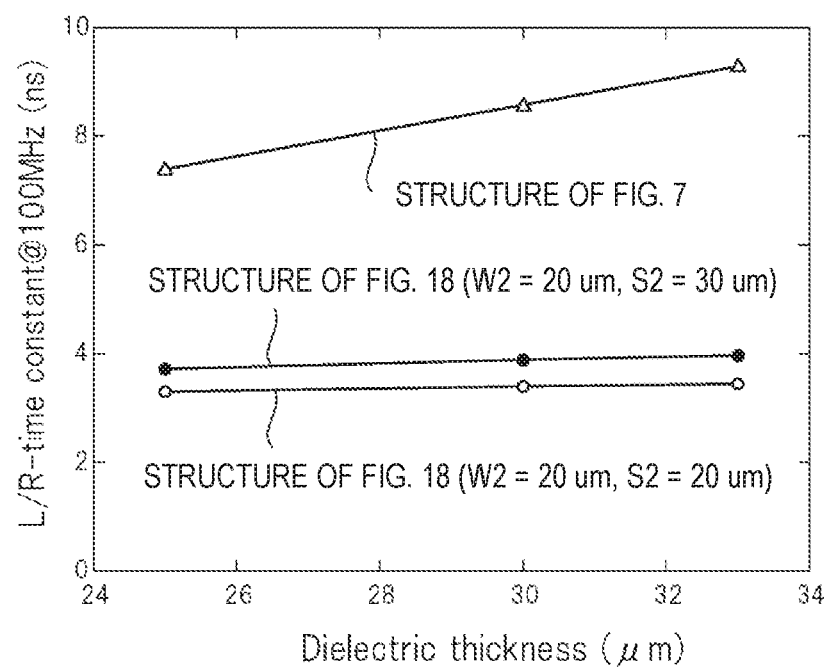
FIG. 17 is a graph showing a dependence of a time constant L/R on the thickness of an insulating layer.

FIGS. 16 and 17 are graphs showing the dependence of the time constant L/R on the thickness of the insulator layer. Horizontal axis of FIGS. 16 and 17 corresponds to the thickness of the insulator layer interposed between the power supply pattern and the ground pattern (thus the spacing between the power supply pattern and the ground pattern in the thickness direction), the interval D1, D2 corresponds to this FIG. 16 shows a case where the structure shown in the upper side of FIG. 7 is applied, and a case where the structure shown in the lower side of FIG. 7 is applied. Incidentally, in the case of applying the configuration shown in the lower side of FIG. 7, the width of the micro-element EL10 (corresponding to the width W1) is set to 20 μm, and both the case of setting the interval (corresponding to the interval S1) between adjacent micro-elements EL10 to 50 μm and the case of setting the interval to 80 μm are graphed. FIG. 17 shows a case of applying the structure shown in the upper side of FIG. 7, and a case of applying the structure shown in the lower side of FIG. 15. In the case of applying the configuration shown in the lower side of FIG. 15, the width of the micro-element EL10, EL12 (corresponding to the width W2) is set to 20 μm, and both the case of setting the interval between adjacent micro-elements EL10, EL12 (corresponding to the interval S2) to 30 μm and the case of setting the interval to 20 μm are graphed.

As can be seen from the graph of FIGS. 16 and 17, when applying the structure shown in the upper side of FIG. 7, according to the theory, the thinner the thickness of the insulator layer interposed between the power supply plane and the ground plane (corresponding to the horizontal axis of the graph of FIGS. 16 and 17), the time constant L/R is reduced. This is because, when the thickness of the insulator layer interposed between the power supply plane and the ground plane is reduced, the inductance decreases without changing the resistance.

In contrast, as can be seen from the graph of FIGS. 16 and 17, and the case of the structure shown in the lower side of FIG. 7, in the case of the structure shown in the lower side of FIG. 15, as compared with the case of the structure shown in the upper side of FIG. 7, the time constant L/R can be about half, also, it is possible to reduce the dependence on the thickness of the insulator layer of the time constant L/R (corresponding to the horizontal axis of the graph of FIGS. 16 and 17). That is, when applying the first technique or the second technique, without thinning the thickness of the insulator layer interposed between the power supply plane and the ground plane in the thickness direction (corresponding to the horizontal axis of the graph of FIGS. 16 and 17), the time constant L/R can be sufficiently reduced, and, even if the thickness of the insulator layer is slightly varied, the time constant L/R is hardly varied It will be. For this reason, in the first and second arts, manufacturing variations in the thickness of the insulator layer interposed between the power supply plane and the ground plane in the thickness direction can be tolerated. Further, it is possible to increase the degree of freedom in the design of the thickness of the insulator layer interposed between the power supply plane and the ground plane. Therefore, compared to the parallel-plate (power supply and ground planes pair) structure, the structure to which the first technique is applied and the structure to which the second technique is applied is advantageous in that it ensures the rigidity and mechanical strength of the wiring substrate, and also in that it ensures the durability and reliability of the insulator layers constituting the wiring substrate.

In the graph of FIG. 16, when the structure shown in the lower side of FIG. 7 is applied, the time constant L/R is smaller when the interval (corresponding to the interval S1) between adjacent micro-elements EL10 is increased. This is in accordance with the theory described in connection with the first technique. In the graph of FIG. 17, when the structure shown in the lower side of FIG. 15 is applied, the time constant L/R is smaller when the interval (corresponding to the interval S2) between adjacent micro-elements EL10, EL12 is smaller. This is also the same as the theory described in connection with the second technique.

Further, the parallel plate (power supply and ground planes pair) structure, the structure to which the first technique is applied, and the structure to which the second technique is applied, since the product of the inductance and the capacitance becomes almost the same, the propagation delay of the noise signal becomes almost the same. Therefore, even when applying the first technique and applying the second technique, as in the case of applying a parallel plate (power supply and ground planes pair) structure, it is possible to design the inductance, capacitance and resonant frequency, electrical design is not difficult.

Figure 18:
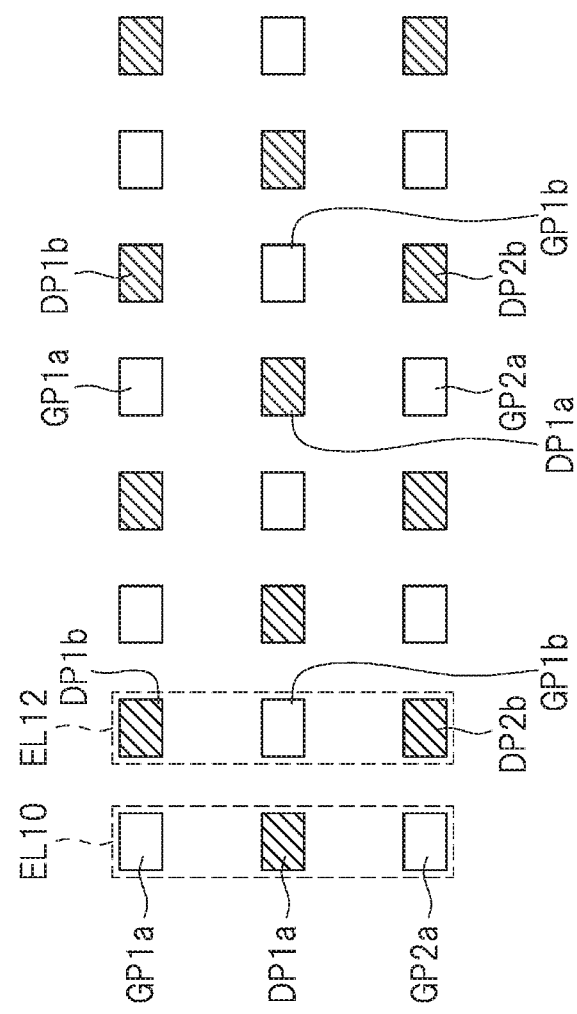
FIG. 18 is a cross-sectional view showing a power supply wiring of a wiring substrate and a ground wiring of the wiring substrate.
Figure 19:
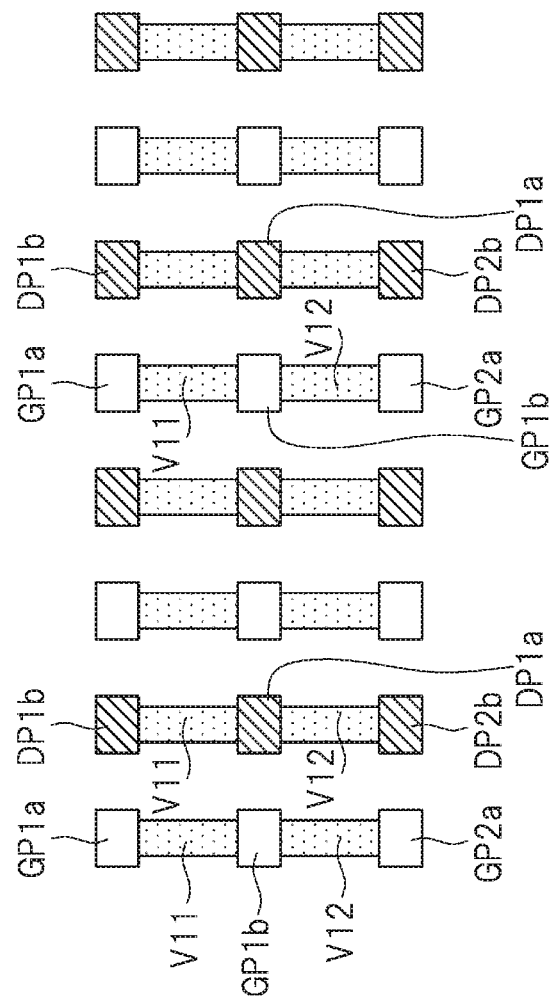
FIG. 19 is a cross-sectional view showing the power supply wiring of the wiring substrate and the ground wiring of the wiring substrate.
Figure 20:
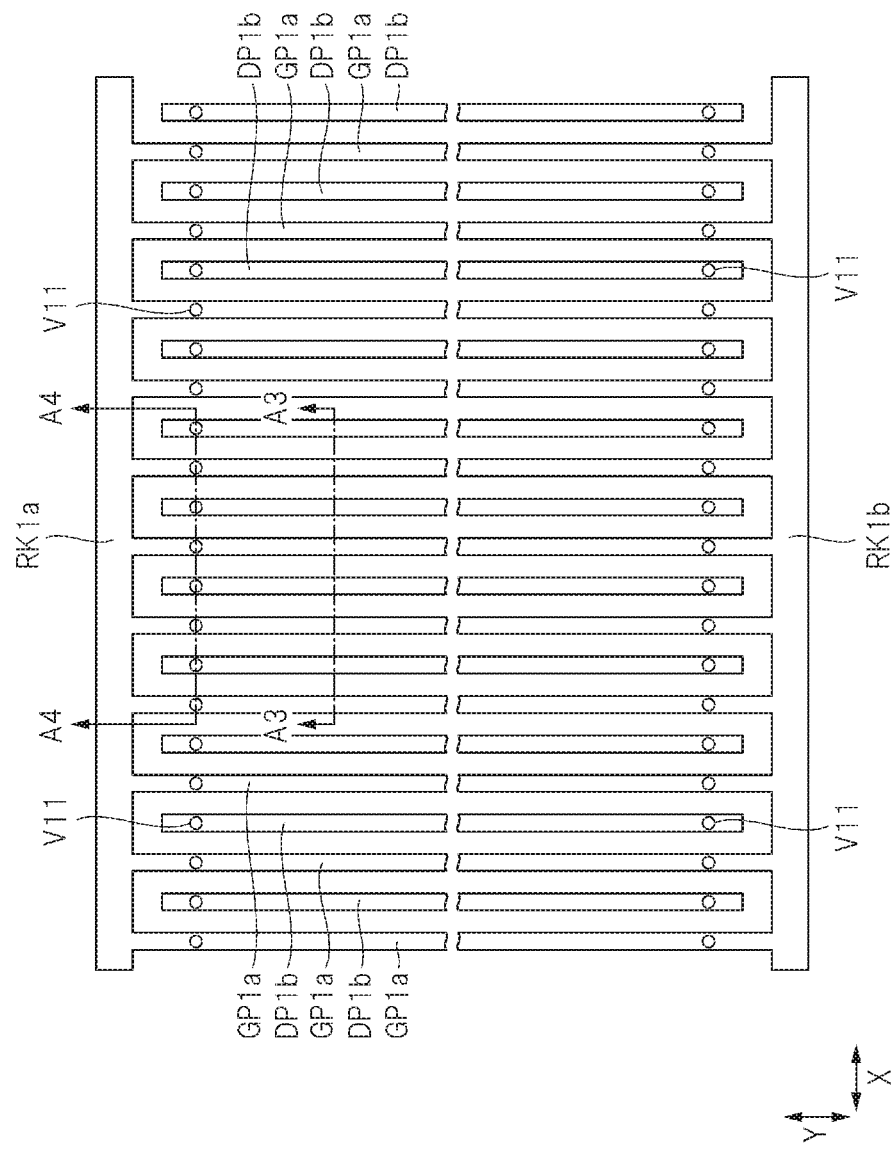
FIG. 20 is a plan view showing the power supply and ground wirings of the wiring substrate.
Figure 21:
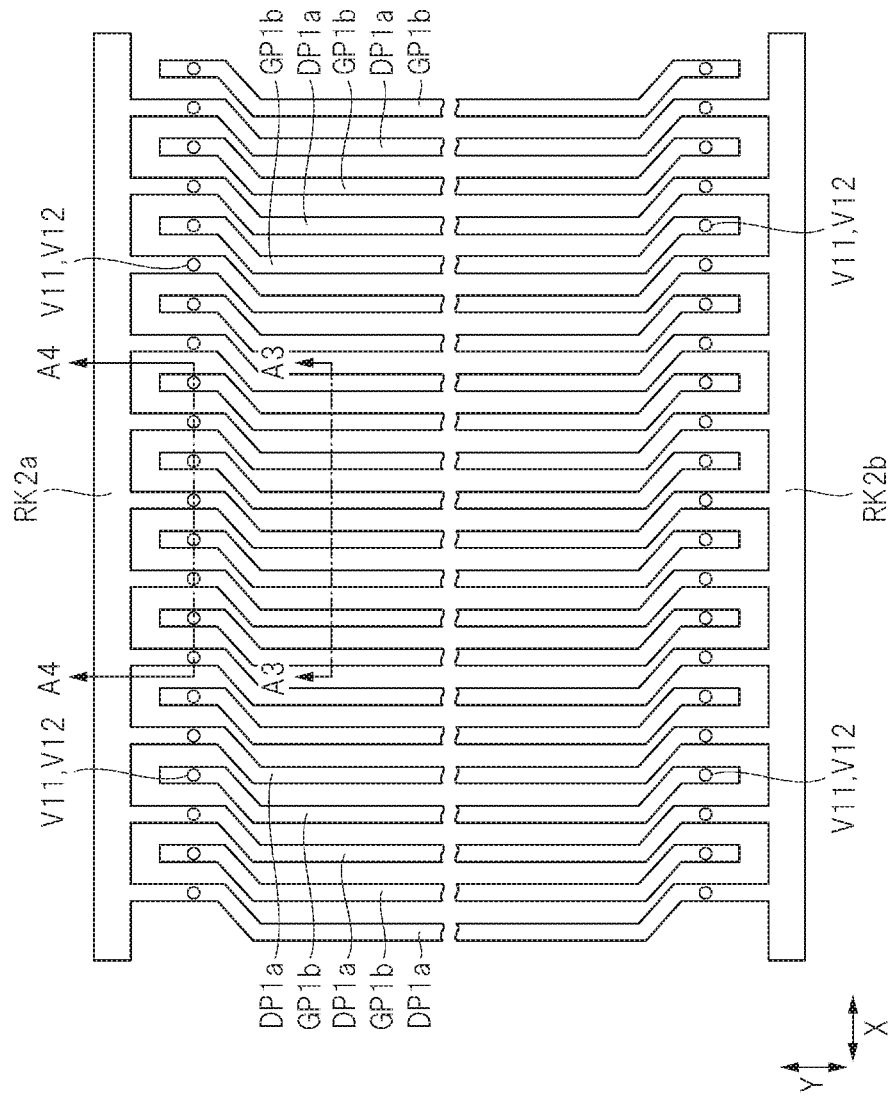
FIG. 21 is a plan view showing the power supply and ground wirings of the wiring substrate.
Figure 22:
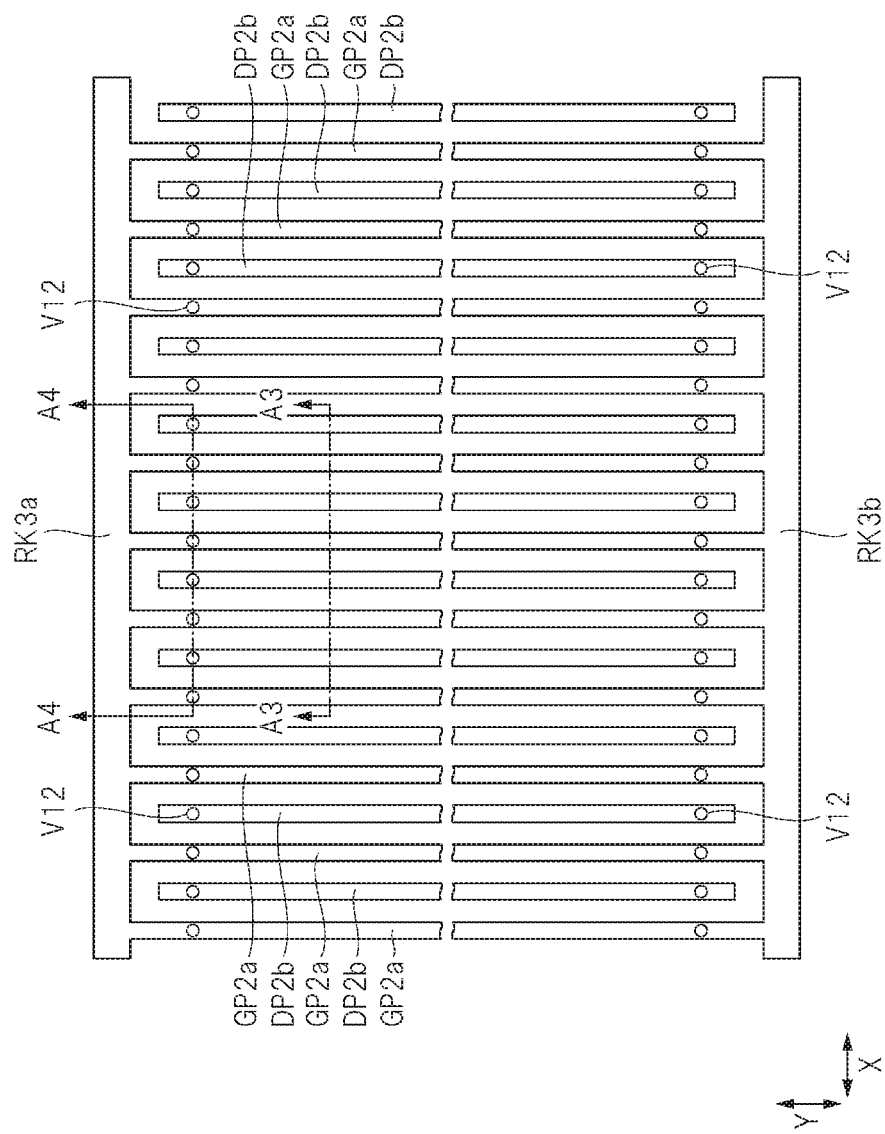
FIG. 22 is a plan view showing the power supply and ground wirings of the wiring substrate.

Next, a specific example of a method of connecting a plurality of power supply patterns in parallel and connecting a plurality of ground patterns in parallel when the second technique is applied will be described with reference to FIGS. 18 to 22. FIGS. 18 and 19 are cross-sectional view showing the power and ground wiring of the wiring substrate, and FIGS. 20 to 22 are plan view showing the power and ground wiring of the wiring substrate. The cross-sectional view at the position of A3-A3 line in FIGS. 20-22 corresponds approximately to FIG. 18, and cross-sectional view at the position of A4-A4 line in FIGS. 20-22 corresponds approximately to FIG. 19. In FIGS. 18 and 19, so as to be easy to distinguish between the power supply wiring and the ground wiring, the power supply voltage is provided with hatching of the diagonal line, also, the via V11, V12 is a hatching of the dots, for the ground wiring ground potential is supplied, the hatching is omitted. In plan view of FIGS. 20 to 22, hatching is not used.

The structure of FIGS. 18 to 22 is based on the structure shown in the lower side of FIG. 15. Therefore, the line-shaped ground pattern GP1a of the micro-element EL10, and the line-shaped power supply pattern DP1b of the micro-element EL12 is formed in the same wiring layer in the wiring substrate, the wiring layer is shown in FIG. 20. Further, the line-shaped power supply pattern DP1a of the micro-element EL10, and the line-shaped ground pattern GP1b of the micro-element EL12 is formed in the same wiring layer in the wiring substrate, the wiring layer is shown in FIG. 21. Further, the line-shaped ground pattern GP2a of the micro-element EL10 and the line-shaped power supply pattern DP2b of the micro-element EL12 are formed in the same wiring layer in the wiring substrate, the wiring layer is shown in FIG. 22. The wiring layer shown in FIG. 21 is one lower layer of wiring layer than the wiring layer shown in FIG. 20, and the wiring layer shown in FIG. 22 is one lower layer of wiring layer than the wiring layer shown in FIG. 21.

In the wiring layer shown in FIG. 20, a ground pattern GP1a extending in the Y direction, and the power supply pattern DP1b extending in the Y direction are arranged alternately in the X direction. Further, in one lower layer of the wiring layer than in FIG. 20, as shown in FIG. 21, a power supply pattern DP1a extending in the Y direction, and the ground pattern GP1b extending in the Y direction are arranged alternately in the X direction. Further, in one lower layer of the wiring layer than in FIG. 21, as shown in FIG. 22, a ground pattern GP2a extending in the Y direction, and the power supply pattern DP2b extending in the Y direction are arranged alternately in the X direction. As shown in FIG. 20, one end portions of the plurality of ground pattern GP1a extending in the Y direction is connected to each other by a connecting conductor pattern RK1a extending in the X direction, also the other end portions of the plurality of ground pattern GP1a extending in the Y direction is connected to each other by a connecting conductor pattern RK1b extending in the X direction. Further, as shown in FIG. 22, one end portions of the plurality of ground pattern GP2a extending in the Y direction is connected to each other by a connecting conductor pattern RK3a extending in the X direction, also the other end portions of the plurality of ground pattern GP2a extending in the Y direction is connected to each other by a connecting conductor pattern RK3b extending in the X direction. Further, as shown in FIG. 21, one end portions of the plurality of power supply pattern DP1a extending in the Y direction is connected to each other by a connecting conductor pattern RK2a extending in the X direction, also the other end portions of the plurality of power supply pattern DP1a extending in the Y direction is connected to each other by a connecting conductor pattern RK2b extending in the X direction.

Other than the vicinity of both ends of the power supply pattern DP1a (central area in the Y direction), in a plan view, overlaps both the ground pattern GP1a and the ground pattern GP2a. Further, other than the vicinity of both ends of the ground pattern GP1b (central area in the Y direction), in a plan view, overlaps both the power supply pattern DP1b and the power supply pattern DP2b. As a result, a cross-sectional configuration as shown in FIG. 18 is obtained except in the vicinity of both ends in the Y direction, and the above-described micro-element EL10 and micro-element EL12 are alternately arranged.

Further, in the wiring layer shown in FIG. 21, each of the power supply pattern DP1a extending in the Y direction, in the vicinity of both end portions in the Y direction, the position of the X direction is shifted by half of the arrangement pitch of the power supply pattern DP1a. Further, in the wiring layer shown in FIG. 21, each of the ground pattern GP1b extending in the Y direction, in the vicinity of both end portions in the Y direction, the position of the X direction is shifted by half of the arrangement pitch of the ground pattern GP1b.

Therefore, the vicinity of both end portions in the Y direction of the power supply pattern DP1a, in a plan view, overlap with both the power supply pattern DP1b and the power supply pattern DP2b, and the vicinity of both end portions the Y direction of the ground pattern GP1b, in a plan view, and overlaps with both the ground pattern GP1a and the ground pattern GP2a. In the vicinity of both ends of the power supply pattern DP1a in the Y direction, the power supply pattern DP1a is connected to the power supply pattern DP1b through the via V11, and is connected to the power supply pattern DP2b through the via V12. In the vicinity of both ends of the ground pattern GP1b in the Y direction, the ground pattern GP1b is connected to the ground pattern GP1a through the via V11, and is connected to the ground pattern GP2a through the via V12.

Thus, one end portion of each other of the plurality of power supply pattern DP1b, DP1a, DP2b are connected to each other through the via V11, V12 and the connecting conductor pattern RK2a. Also, the other end portion of each of the plurality of of power supply pattern DP1b, DP1a, DP2b are connected to each other through the via V11, V12 and the connecting conductor pattern RK2b. In addition, one end portions of the plurality of ground patterns GP1a, GP1b, GP2a are connected to each other via the vias V11 and V12 and the connection conductor pattern RK1a, RK3a, and the other end portions of the plurality of ground patterns GP1a, GP1b, GP2a are connected to each other via the vias V11 and V12 and the connection conductor pattern RK1b, RK3b. Thus, a plurality of power supply pattern DP1b shown in FIG. 20, a plurality of power supply pattern DP1a shown in FIG. 21, and a plurality of power supply pattern DP2b shown in FIG. 22 can be connected in parallel, thereby electrically connected to each other. Further, a plurality of ground pattern GP1a shown in FIG. 20, a plurality of around pattern GP1b shown in FIG. 21, and a plurality of ground pattern GP2a shown in FIG. 22 can be connected in parallel, thereby electrically connected to each other.

Further, it is possible to draw the power supply pattern DP1b, DP1a, DP2b to other planar regions (other regions in plan view) using the wiring of any of the three wiring layers of FIGS. 20, 21 and 22. Further, FIG. 20, using any of the wiring of the three wiring layers of FIGS. 21 and 22, it is possible to draw the ground pattern GP1a, GP1b, GP2a to the other regions (other regions in plan view).

The structure of FIGS. 18-22 is suitable, such as when it is possible to reduce the diameter of the via V11, V12 than the respective widths of the power supply pattern DP1b, DP1a, DP2b and the ground pattern GP1a, GP1b, GP2a.

Figure 23:
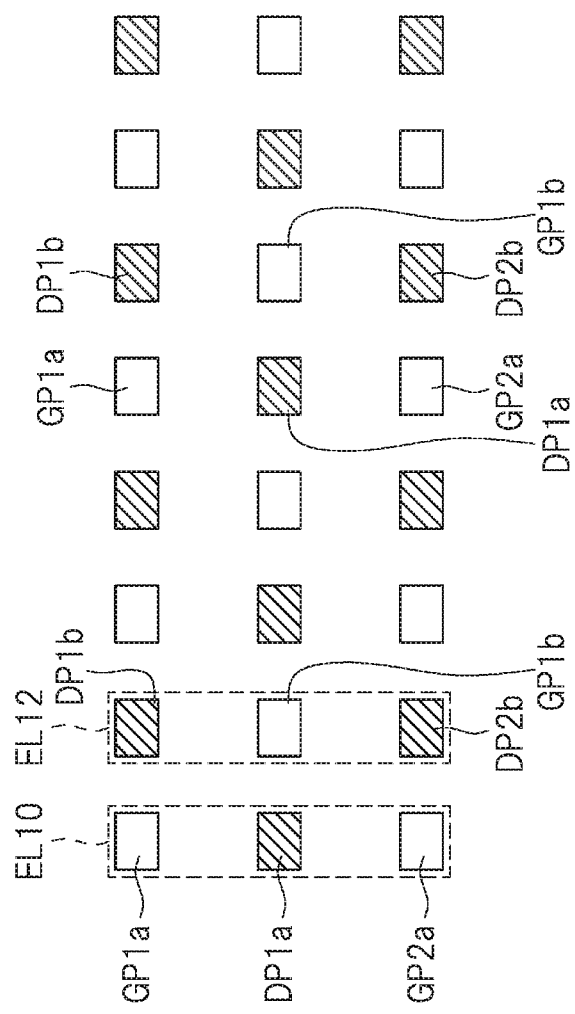
FIG. 23 is a cross-sectional view showing a power supply wiring of a wiring substrate and a ground wiring of the wiring substrate.
Figure 24:
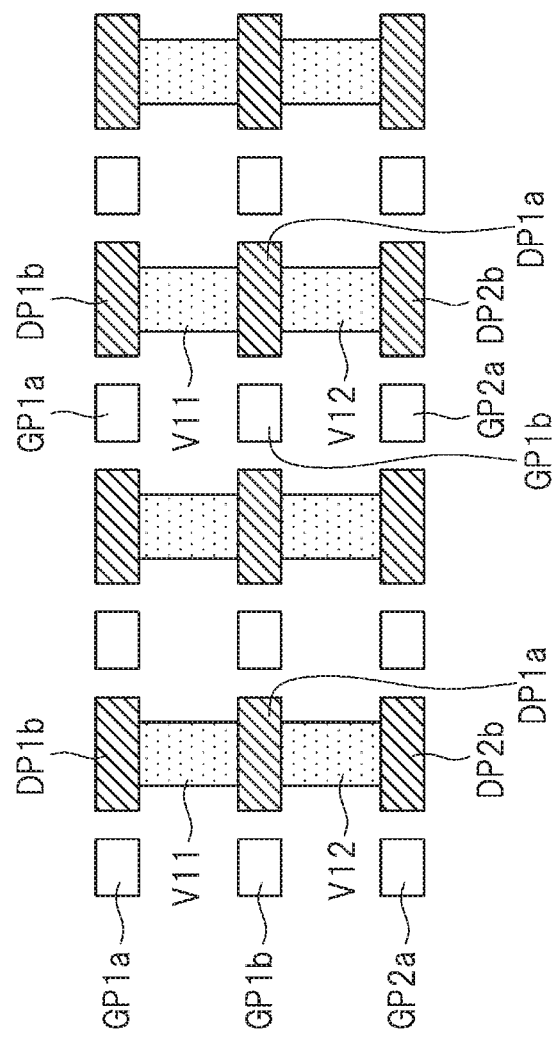
FIG. 24 is a cross-sectional view showing the power supply wiring of the wiring substrate and the ground wiring of the wiring substrate.
Figure 25:
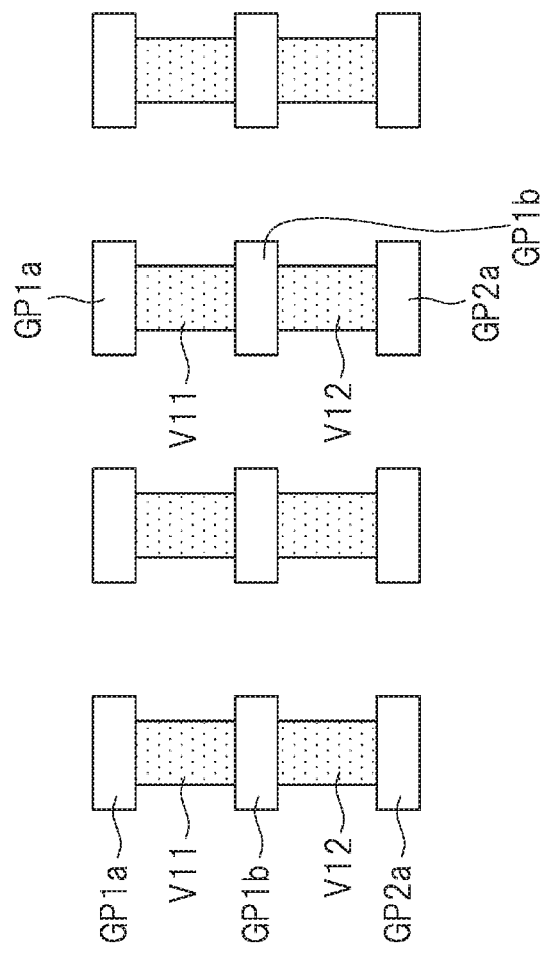
FIG. 25 is a cross-sectional view showing the power supply wiring of the wiring substrate and the ground wiring of the wiring substrate.
Figure 26:
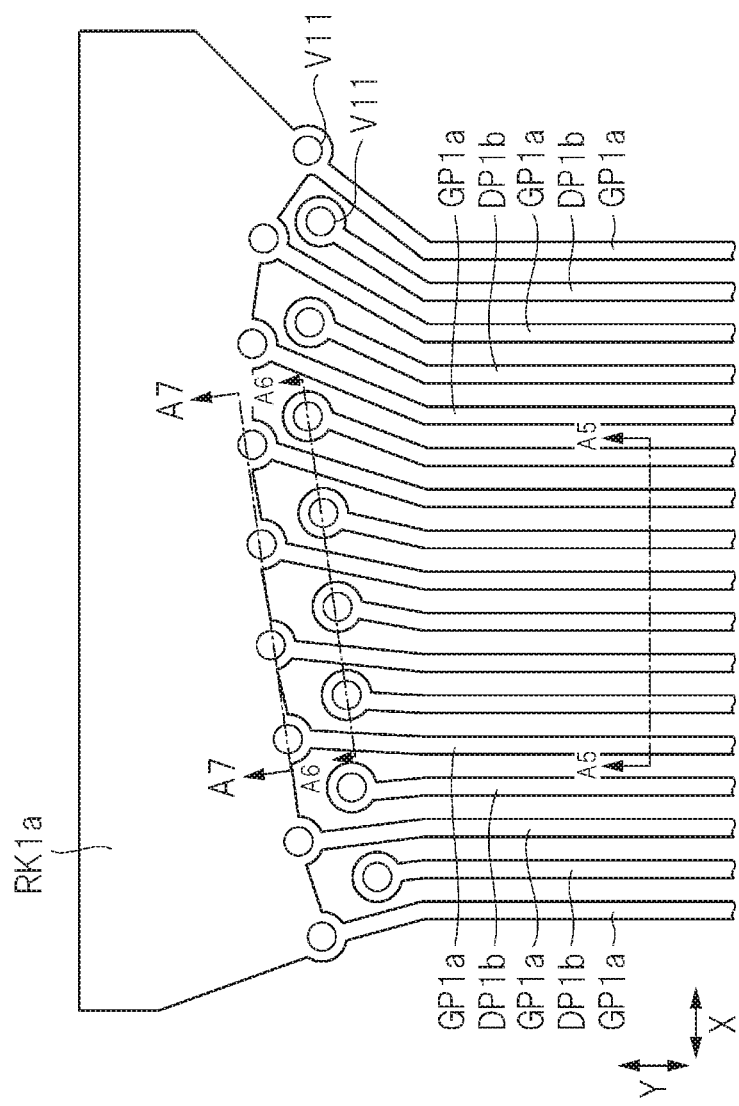
FIG. 26 is a plan view showing the power supply and ground wirings of the wiring substrate.
Figure 27:
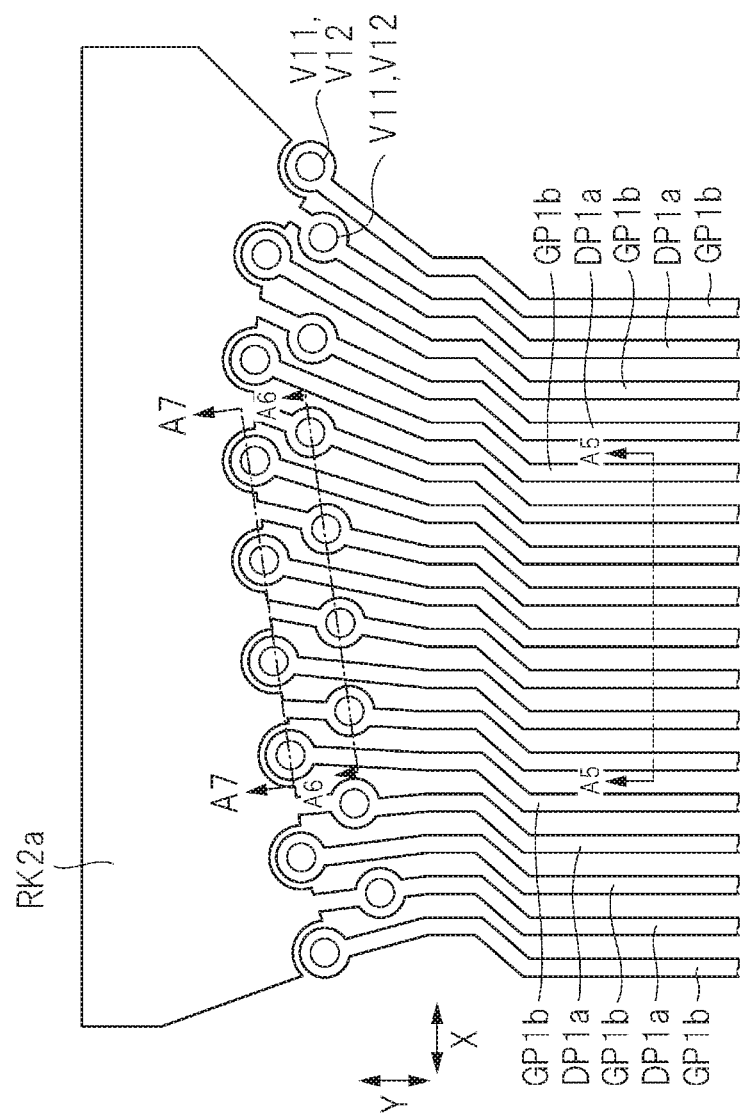
FIG. 27 is a plan view showing the power supply and ground wirings of the wiring substrate.
Figure 28:
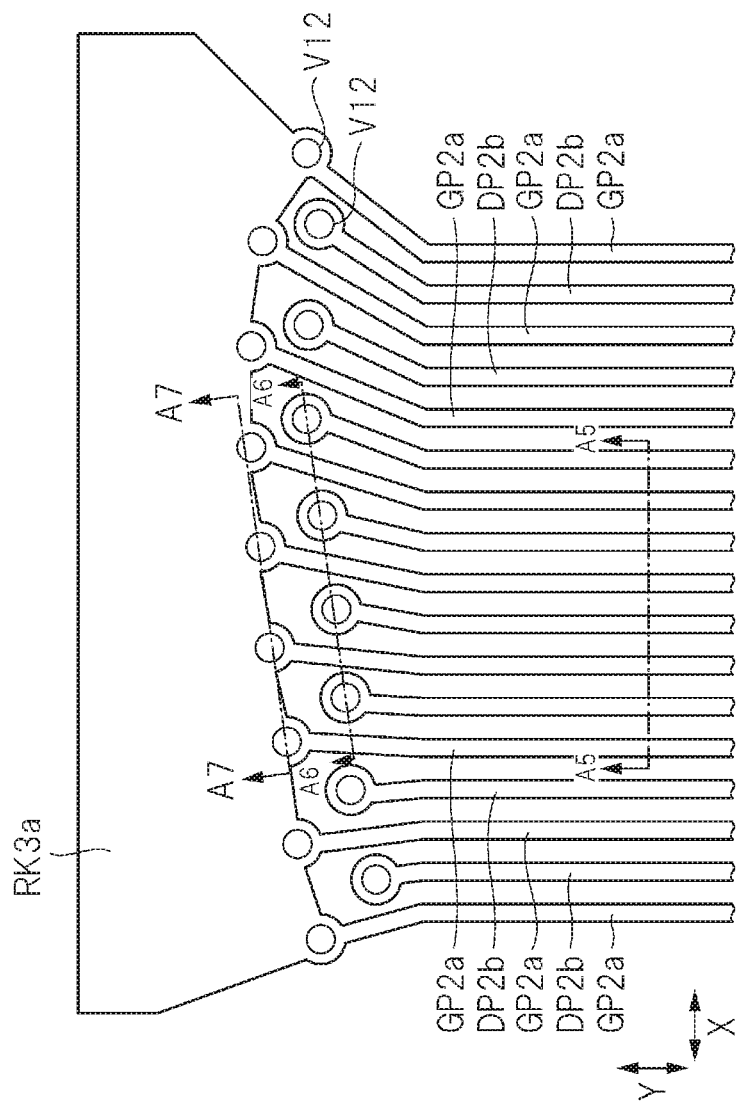
FIG. 28 is a plan view showing the power supply and ground wirings of the wiring substrate.

Next, a modified example of the method of FIGS. 18 to 22 will be described with reference to FIGS. 23 to 28. FIGS. 23 to 25 are cross-sectional view showing the power and ground wiring of the wiring substrate, and FIGS. 26 to 28 are plan view showing the power and ground wiring of the wiring substrate. Cross-sectional view at the position of A5-A5 line in FIGS. 26-28 approximately corresponds to FIG. 23, cross-sectional view at the position of A6-A6 line in FIGS. 26-28 approximately corresponds to FIG. 24, and cross-sectional view at the position of A7-A7 line in FIGS. 26-28 approximately corresponds to FIG. 25. In FIGS. 23 to 25, so as to be easy to distinguish between the power supply wiring and the ground wiring, the power supply wiring to which the power supply voltage is supplied is hatched diagonal line, also, the via V11, V12 is hatched dots, for the ground wiring to which the ground potential is supplied is omitted hatching. In plan view of FIGS. 26 to 28, hatching is not used. FIG. 26 shows a part of the wiring layer corresponding to FIG. 20. FIG. 27 shows a part of the wiring layer corresponding to FIG. 21. Also, FIG. 28 shows a part of the wiring layer corresponding to FIG. 22.

The structure of FIGS. 23 to 28 differs from the structure of FIGS. 18 to 22 in the following points. That is, in the case of the structure of FIGS. 23 to 28, as compared with the central area in the Y direction, near both ends in the Y direction, the interval between the power supply pattern (DP1$b$, DP1$a$, DP2$b$) and the ground pattern (GP1$a$, GP1$b$, GP2$a$) in the X direction is widened. Thus, even when the planar dimensions of the via V11, V12 (diameter) is large, it is easy to place the via V11, V12. Otherwise, the structure of FIGS. 23 to 28 is similar to the structure of FIGS. 18 to 22, and therefore a repetitive description thereof is omitted here. The structure of FIGS. 23-28 is suitable, such as when the diameter of the via V11, V12 is larger than the respective widths of the power supply pattern DP1$b$, DP1$a$, DP2$b$ and the ground pattern GP1$a$, GP1$b$, GP2$a$.

Either way, by shifting the power supply pattern (DP1$a$) and the ground pattern (GP1$b$) of any of the wiring layer in the vicinity of both ends, the power supply patterns (DP1$b$, DP1$a$, DP2$b$) and the ground pattern (GP1$a$, GP1$b$, GP2$a$) in the vicinity of each of both ends, overlapping the power supply pattern (DP1$b$, DP1$a$, DP2$b$) to each other in plan view, and so that the ground pattern (GP1$a$, GP1$b$, GP2$a$) to each other overlap in plan view. In the overlapping area, the power supply patterns (DP1$b$, DP1$a$, DP2$b$) may be connected to each other by vias (V11, V12), and the ground patterns (GP1$a$, GP1$b$, GP2$a$) may be connected to each other by vias (V11, V12).

Even when applying the first technique, a plurality of power supply patterns is connected in parallel, and a plurality of ground patterns are connected in parallel. For example, in the case of the structure shown in the lower side of FIG. 7, one end of the plurality of power supply pattern DP1 is connected by a connecting conductor pattern extending in a direction substantially perpendicular to the extending direction of the power supply pattern DP1, also the other end of the plurality of power supply pattern DP1 is connected by a connecting conductor pattern extending in a direction substantially perpendicular to the extending direction of the power supply pattern DP1. Further, one end portions of the plurality of ground pattern GP1 is connected by a connecting conductor pattern extending in a direction substantially perpendicular to the extending direction of the ground pattern GP1, also the other end portions of the plurality of ground pattern GP1 is connected by a connecting conductor pattern extending in a direction substantially perpendicular to the extending direction of the ground pattern GP1. Further, one end portions of the plurality of ground pattern GP2 is connected by a connecting conductor pattern extending in a direction substantially perpendicular to the extending direction of the ground pattern GP2, also the other end portions of the plurality of ground pattern GP2 is connected by a connecting conductor pattern extending in a direction substantially perpendicular to the extending direction of the ground pattern GP2. Then, a connecting conductor pattern for connecting the plurality of ground pattern GP1, and a connecting conductor pattern for connecting the plurality of ground pattern GP2 is electrically connected via or the like. Thus, in the case of the structure shown in the lower side of FIG. 7, a plurality of power supply pattern DPA connected in parallel, and a plurality of ground pattern GP1, GP2 can be connected in parallel.

<Applied Part of First Technique and Second Technique>

Next, the arrangement positions of the power supply wiring and the ground wiring to which the first technique or the second technique is applied will be described.

The first technique and the second technique are applied to semiconductor device including a semiconductor chip and a wiring substrate, i.e., a technique applied to the power supply wiring and ground wiring of the wiring substrate included in semiconductor device. The electronic device DS shown in FIG. 1 includes each wiring substrate PB1 and PB2, and one or both of the first technique and the second technique can be applied to the power supply wirings and the ground wirings provided in each wiring substrate PB1 and PB2.

In the electronic device DS shown in FIG. 1 above, the position of the power supply wiring and ground wiring suitable for applying a first technique or a second technique will be described below.

A capacitor C1 functioning as a decoupling capacitor is mounted on the wiring substrate PB1, and a capacitor C2 functioning as a decoupling capacitor is mounted on the wiring substrate PB2. As described above, when the power consumption of the semiconductor chip CP is suddenly changed, the current change portion is a decoupling capacitor (capacitor C1, C2 in this case) can be supplied (compensated), the power supply voltage supplied to the semiconductor chip CP to suppress the fluctuation, it is possible to suppress the occurrence of noise.

When the current from the capacitor C1 to the semiconductor chip CP is supplied, the current supplied from the semiconductor chip CP is supplied to the semiconductor chip CP through the power supply line 3 of the wiring substrate PB1. Further, when the current from the capacitor C2 to the semiconductor chip CP is supplied, the current supplied from the semiconductor chip CP is supplied to the semiconductor chip CP through the power supply line 6 of the wiring substrate PB2.

Therefore, in the wiring substrate PB1, when the current is supplied from the capacitor C1 to the semiconductor chip CP, the power supply wiring 3 at a position that can be a path through which the electric current passes, it is preferable to apply the first technique or the second technique. Further, in the wiring substrate PB2, when the current is supplied from the capacitor C2 to the semiconductor chip CP, the power supply wiring 6 at a position that can be a path through which the electric current passes, it is preferable to apply the first technique or the second technique. That is, in the wiring substrate PB1, the power supply wiring applying the first technique or the second technique (the power supply pattern DP, DP1, DP1$a$, DP1$b$, DP2, DP2$b$), when the current is supplied from the capacitor C1 to the semiconductor chip CP, the capacitor C1 it is preferable that the current supplied from (alternating current) flows. Further, in the wiring substrate PB2, the power supply wiring applying the first technique or the second technique (the power supply pattern DP, DP1, DP1$a$, DP1$b$, DP2, DP2$b$), when the current is supplied from the capacitor C2 to the semiconductor chip CP, the capacitor C2 it is preferable that the current supplied from (AC current) flows.

For example, as shown in FIG. 1, in the wiring substrate PB1, for the power supply wiring 3 and the ground wiring 4 is formed in the area RG1 surrounded by a dotted line, applying a first technique or a second technique. Further, in the wiring substrate PB2, the power supply wiring 6 and the ground wiring 7 is formed in the area RG2 surrounded by a dotted line, applying the first technique or the second technique. In the wiring substrate PB1, the power supply line 3 formed in the area RG1, when the current is supplied from the capacitor C1 to the semiconductor chip CP, the current supplied from the capacitor C1 current) flows. Further, in the wiring substrate PB2, the power supply line 6 formed in the area RG2, when the current is supplied from the capacitor C2 to the semiconductor chip CP, the current supplied from the capacitor C2 (AC current) flows.

Thus, when the current from the decoupling capacitor (here the capacitor C1, C2) to the semiconductor chip CP is supplied, the power supply wiring through which the electric current flows (3, 6), it is possible to reduce the time constant L/R (L/R ratio). Therefore, it is possible to converge the variation of the power supply voltage supplied to the semiconductor chip CP in a shorter time, the variation of the power supply voltage during operation of the semiconductor chip CP (power supply voltage supplied to the semiconductor chip CP) more accurately suppressed, it is possible to more accurately suppress the occurrence of noise.

As described above, it is preferable that the power supply wiring (the power supply wiring in the region RG1, RG2) to which the first art or the second technology is applied in the wiring substrate PB1 and PB2 functions as the conduction path (AC path) of the AC current supplied from the decoupling capacitor (here, the capacitors C1 and C2) when the power consumed by the semiconductor chip CP suddenly changes. On the other hand, each wiring substrate PB1 and PB2 also have power supply wirings serving as DC paths for DC currents supplied from VRM 1 to the semiconductor chips CP. DC path in the wiring substrate PB2, for example, corresponds to the power supply wiring in the vicinity of the arrow YG (including vias) in FIG. It is preferable that the DC path in the wiring substrate PB2 is a shortest path that connects the semiconductor chip CP and the wiring substrate PB1 with the shortest DC path. Note that the DC path of the wiring substrate PB2, not only the DC current supplied from VRM 1, the AC current supplied from the capacitor C1 can also flow.

Compared to the capacitor C1 mounted on the wiring substrate PB1, the capacitor C2 mounted on the wiring substrate PB2 is located closer to the semiconductor chip CP. Therefore, when supplying a current from the capacitor C2 to the semiconductor chip CP, the propagation delay is short, it is possible to supply a current in a relatively short time. In other words, it is possible to supply an AC current of a relatively high frequency from the capacitor C2 to the semiconductor chip CP. On the other hand, since the capacitor C2 mounted on the wiring substrate PB2 is relatively far from the semiconductor chip CP, the propagation delay is long when the current is supplied from the capacitor C1 to the semiconductor chip CP, and the current supply takes a relatively long time. In other words, a relatively low frequency alternating current is supplied from the capacitor C2 to the semiconductor chip CP. In any case, in the wiring substrate PB2, by applying the first technique or the second technique to the path AC current flows from the capacitor C2, the variation of the power supply voltage during operation of the semiconductor chip CP can be more accurately suppressed. Further, in the wiring substrate PB1, by applying the first technique or the second technique to the path AC current flows from the capacitor C1, it is possible to more accurately suppress the variation of the power supply voltage during operation of the semiconductor chip CP. Therefore, it is possible to improve the performance of semiconductor device.

Figure 29:
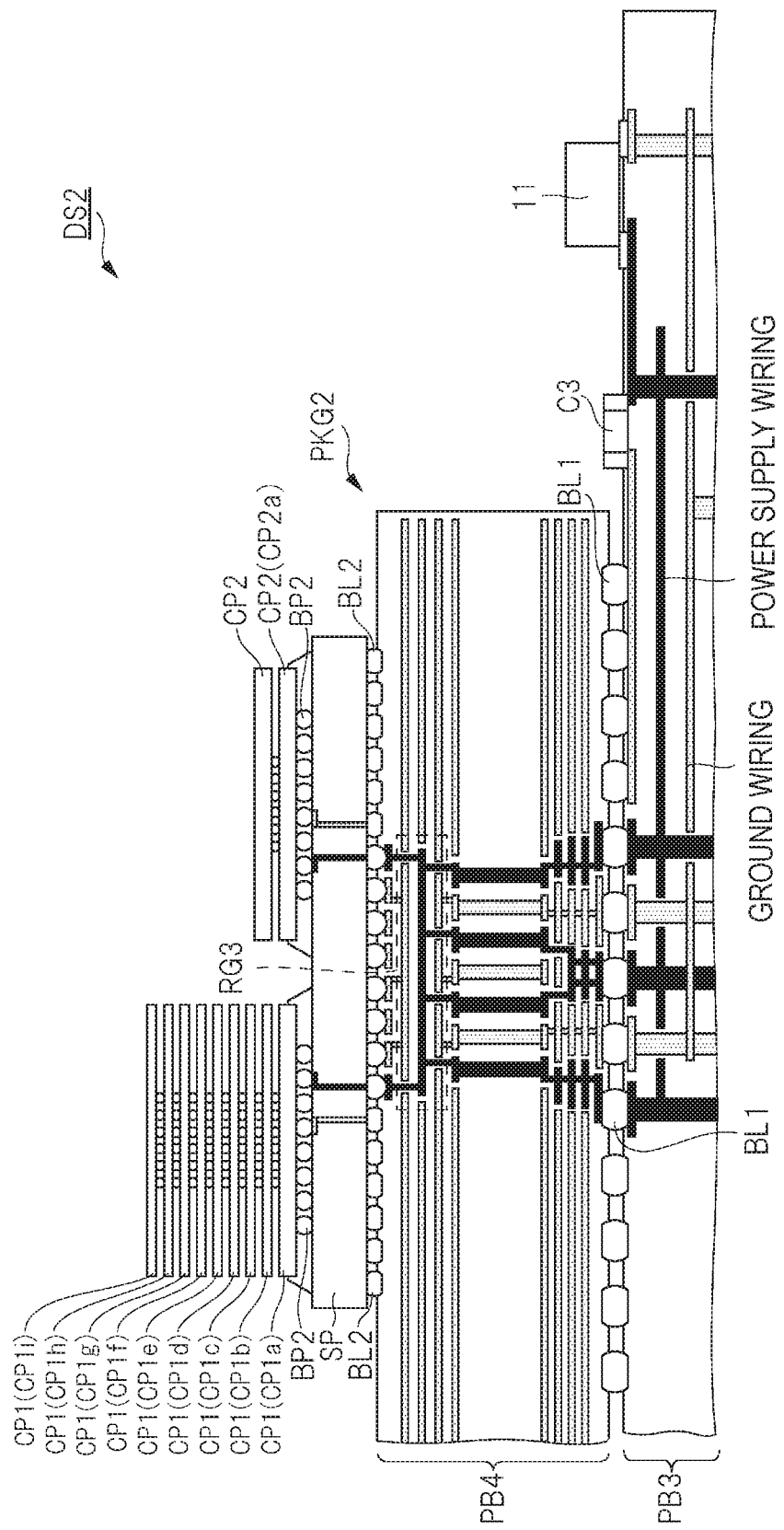
FIG. 29 is a cross-sectional view of an electronic device according to another embodiment.

FIG. 29 is a cross-sectional view of an electronic device DS2 according to the Embodiment 2.

As shown in FIG. 29, the electronic device DS2 according to the Embodiment 2 has a wiring substrate (mounting substrate) PB3, a semiconductor device (semiconductor package) PKG2, a capacitor C3, and a VRM 11 mounted on the wiring substrate PB3. Further other electronic components (not shown) may be mounted on the interconnect substrate PB3.

The semiconductor device PKG 2 includes a wiring substrate PB4, an interposer (relay substrate, silicon interposer) SP mounted on the wiring substrate PB4, a plurality of semiconductor chips CP1 mounted on the interposer SP in a stacked manner, and a plurality of semiconductor chips CP2 mounted on the interposer SP in a separated manner from the plurality of semiconductor chips CP1. A plurality of semiconductor chip CP1 and a plurality of semiconductor chip CP2 are arranged side by side with each other on the interposer SP.

In the electronic device DS2, since semiconductor device PKG2 including the semiconductor chip CP1, CP2 is mounted on the wiring substrate PB3, the electronic device DS2 includes the semiconductor chip. For this reason, the electronic device DS2 can also be regarded as semiconductor device.

Of the plurality of semiconductor chips CP1 included in semiconductor device PKG 2, the lowest semiconductor chip CP1$a$ is a semiconductor chip CP1$a$ for control, and the plurality of semiconductor chips CP1 above the semiconductor chip CP1$a$ for control is a memory chip CP1$b$~CP1$i$ including memory circuits. The semiconductor chip CP1$a$ can control a plurality of memory chips CP1$b$~CP1$i$ mounted on the semiconductor chip CP1$a$. A semiconductor chip CP2 is a logic chip comprising logic circuitry or the like that controls the semiconductor chip CP1$a$ and processes data sent from the semiconductor chip CP1$a$. Of the stacked plurality of semiconductor chip CP2, the lowermost semiconductor chip CP2 is referred to as a semiconductor chip CP2$a$. A plurality of semiconductor chip CP1 stacked, through a plurality of bump electrodes interposed between them, are electrically connected to each other. Further, a plurality of semiconductor chip CP2 stacked, through a plurality of bump electrodes interposed between them, are electrically connected to each other.

The semiconductor chip CP1$a$, CP2$a$ is electrically connected to the wiring of the wiring substrate PB4 via a plurality of bump electrodes BP2 interposed between the semiconductor chip CP1$a$, CP2$a$ and the interposer SP, a plurality of through vias provided in the interposer SP, and a plurality of solder balls BL2 interposed between the interposer SP and the wiring substrate PB4.

A plurality of solder balls BL1 arranged on the lower surface of the wiring substrate PB4 constituting semiconductor device PKG are connected to a plurality of terminal patterns for connecting the solder balls upper surface of the wiring substrate PB3. As a result, the wiring of the wiring substrate PB3 and the wiring of the wiring substrate PB4 are electrically connected to each other via the soldering ball BL1.

Each wiring substrate PB3 and PB4 has a plurality of wiring layers, and each wiring layer has a plurality of wirings as required, and these wirings constitute the inner wirings of each wiring substrate PB3 and PB4. Each wiring substrate PB3 and PB4 includes, as inner wirings, a power supply wiring to which power supply voltages generated in VRM 11 are supplied, a ground wiring to which a ground potential supplied, and a signal wiring to which a signal is transmitted. In FIG. 29, in order to make it easy to distinguish the power supply wiring from the ground wiring, the power supply wiring is indicated by a black fill in the wiring substrate PB3 and PB4, the ground wiring is indicated by a hatch of dots, and the signal lines are omitted from the illustration.

The power supply voltages generated by VRM 11 are supplied to the semiconductor chip CP1, CP2 via the power supply wiring of the wiring substrate PB3, the solder ball BL1, the power supply wiring of the wiring substrate PB4, the solder ball BL2, a plurality of through vias provided in the interposer SP, and the bump electrodes BP2.

A power supply terminal of the semiconductor chip CP1a (power supply voltage input terminal), the power supply terminal of the semiconductor chip CP2a (power supply voltage input terminal), a through via of the bump electrode BP2 and the interposer SP, a solder ball BL2, via the power supply wiring of the wiring substrate PB4, are electrically connected. In the Embodiment 2, in the wiring substrate PB4, the power supply wiring for connecting the semiconductor chip CP1a (power supply terminals) and the semiconductor chip CP2a (power supply terminals of the first technique or applying a second technique). For example, as shown in FIG. 29, in the wiring substrate PB4, for power supply wiring and ground wiring formed in the area RG3 surrounded by dotted lines, applying a first technique or a second technique.

Each of the semiconductor chip CP1, CP2 has a power supply wiring and a ground wiring therein. The power supply wiring in the semiconductor chip CP1, CP2, the power supply voltage supplied to the semiconductor chip CP1, CP2 is supplied, the ground wiring in the semiconductor chip CP1, CP2, the ground potential supplied to the semiconductor chip CP1, CP2 is supplied. Further, each of the semiconductor chip CP1, CP2, in its interior, and a plurality of capacitors disposed between the power supply wiring and the ground wiring (power supply capacitor). In each of the semiconductor chip CP1, CP2, the power supply wiring and the ground wiring are connected via their capacitors (power supply capacitors).

When the power consumption of the semiconductor chip CP1 is suddenly changed, in order to compensate for the current change portion, it is possible to supply a current from the above-described power supply capacitor formed in the semiconductor chip CP2 to the semiconductor chip CP1, thereby suppressing the variation of the power supply voltage supplied to the semiconductor chip CP1, it is possible to suppress the generation of noise. Further, when the power consumption of the semiconductor chip CP2 is suddenly changed, in order to compensate for the current change portion, it is possible to supply a current from the above-described power supply capacitor formed in the semiconductor chip CP1 to the semiconductor chip CP2, thereby suppressing the variation of the power supply voltage supplied to the semiconductor chip CP2, it is possible to suppress the generation of noise.

When current is supplied from the power supply capacitor in the semiconductor chip CP2 to the semiconductor chip CP1, the current is supplied to the semiconductor chip CP1 through the power supply line of the wiring substrate PB4. When current is supplied from the power supply capacitor in the semiconductor chip CP1 to the semiconductor chip CP2, the current is supplied to the semiconductor chip CP2 through the power supply line of the wiring substrate PB4.

Therefore, in the wiring substrate PB4, and when the current from the power supply capacitor in the semiconductor chip CP2 to the semiconductor chip CP1 (AC current) is supplied, the current from the power supply capacitor in the semiconductor chip CP1 to the semiconductor chip CP2 (AC current) is supplied, the current (AC current) to the power supply line at a position that can be a path through, it is preferable to apply the first technique or the second technique. That is, in the wiring substrate PB4, in the power supply wiring applying the first technique or the second technique, when the AC current is supplied from the power supply capacitor in the semiconductor chip CP2 to the semiconductor chip CP1 and, when the AC current is supplied from the power supply capacitor in the semiconductor chip CP1 to the semiconductor chip CP2, it is preferable that the AC current flows. In the interconnect substrate PB4, such alternating current may flow through the power supply traces formed in the area RG3.

Thus, when the current from the power supply capacitor in the semiconductor chip CP2 to the semiconductor chip CP1 (AC current) is supplied, and when the current from the power supply capacitor in the semiconductor chip CP1 to the semiconductor chip CP2 (AC current) is supplied, the power supply line through which the electric current flows, it is possible to reduce the time constant L/R (L/R ratio). Therefore, when the power consumption of the semiconductor chip CP1 is suddenly changed, it is possible to converge the variation of the power supply voltage supplied to the semiconductor chip CP1 in a shorter time, also, when the power consumption of the semiconductor chip CP2 is suddenly changed, the variation of the power supply voltage supplied to the semiconductor chip CP2 can be converged in a shorter time. Therefore, the variation of the power supply voltage during operation of the semiconductor chip CP1, CP2 (power supply voltage supplied to the semiconductor chip CP1, CP2) more accurately suppressed, it is possible to more accurately suppress the generation of noise. Therefore, it is possible to improve the performance of the electronic device or semiconductor device.

Further, in the present embodiment, when the power consumption of the semiconductor chip CP1 is suddenly changed, the power supply capacitor formed in the semiconductor chip CP2 can function as a decoupling capacitor. Also, when the power consumption of the semiconductor chip CP2 is suddenly changed, the power supply capacitor formed in the semiconductor chip CP can function as a decoupling capacitor. Therefore, it is not necessary to mount a capacitor component as a decoupling capacitor on the wiring substrate PB4 or the interposer SP, so that semiconductor device PKG2 can be easily manufactured and the manufacturing costs of semiconductor device PKG2 can be reduced.

The invention made by the present inventor has been described above in detail based on the embodiment, but the present invention is not limited to the embodiment described above, and it is needless to say that various modifications can be made without departing from the gist thereof.

What is claimed is:

1. A semiconductor device comprising:
a first wiring substrate including an upper surface and a plurality of wiring layers; and
a first semiconductor chip,
wherein the first wiring substrate comprises first and second laminated structures,
wherein each of the first and second laminated structures includes:
a first conductive pattern formed in a first wiring layer of the plurality of wiring layers, the first conductive pattern extending in a first direction, the first direction extending along the upper surface of the first wiring substrate; and a second conductive pattern formed in a second wiring layer of the plurality of wiring layers, the second conductive pattern extending in the first direction, the second wiring layer being located one layer below the first wiring layer in cross-sectional view, wherein the first laminated structure is provided to be spaced apart from the second laminated structure for a first interval in a second direction, the second direction extending along the upper surface of the first wiring substrate and crossing the first direction, wherein one of a power supply potential and a ground potential is to be supplied to the first conductive patter, and wherein another one of the power supply potential and the ground potential is to be supplied to the second conductive patter.

2. The semiconductor device according to claim 1, wherein the following formula (1) is established, when:
a width of each of the first and second laminated structures is defined as "W",
a distance between the first conductive pattern and the second conductive pattern in each of the first and second laminated structures is defined as "D",
a thickness of the first conductive pattern or the second conductive pattern is defined as T, and
a distance between the first and second laminated structures arranged next to each other in the second direction is defined as "S", $$T/2 \leq W < D \times 2 \text{ and } D \times 2 < S \leq D \times 5 \qquad (1).$$

3. The semiconductor device according to claim 1, wherein the first conductive pattern of each of the first and second laminated structures lined up in the second direction is coupled in parallel with one another, and
wherein the second conductive pattern of each of the first and second laminated structures lined up in the second direction is coupled in parallel with one another.

4. The semiconductor device according to claim 1, further comprising:
a first capacitor arranged on the upper surface of the first wiring substrate,
wherein a power supply wiring of the first wiring substrate and a ground wiring of the first wiring substrate are coupled with each other via the first capacitor,
wherein in case that the power supply potential is to be supplied to the first conductive pattern, when an electric current flows from the first capacitor to the first semiconductor chip through the power supply wiring of the first wiring substrate, the electric current supplied from the first capacitor is passing through the first conductive patter, and
wherein in case that the power supply potential is to be supplied to the second conductive pattern, when an electric current flows from the first capacitor to the first semiconductor chip through the power supply wiring of the first wiring substrate, the electric current supplied from the first capacitor is passing through the second conductive patter.

5. The semiconductor device according to claim 1, wherein the first semiconductor chip is arranged on the upper surface of the first wiring substrate.

6. The semiconductor device according to claim 1, further comprising:
a second wiring substrate,
wherein the first wiring substrate is arranged on the second wiring substrate, and
wherein the first semiconductor chip is arranged on the upper surface of the first wiring substrate.

7. The semiconductor device according to claim 1, further comprising:
a second wiring substrate,
wherein the second wiring substrate is arranged on the upper surface of the first wiring substrate, and
wherein the first semiconductor chip is arranged on the second wiring substrate.

8. The semiconductor device according to claim 1, wherein each of the first and second laminated structures includes:
a third conductive pattern formed in a third wiring layer of the plurality of wiring layers, and extended in the first direction, the third wiring layer being located one layer below the second wiring layer in cross-sectional view,
wherein the one of the power supply potential and the ground potential is to be supplied to each of the first conductive patter and the third conductive pattern, and
wherein the another one of the power supply potential and the ground potential is to be supplied to the second conductive patter.

* * * * *